(12) United States Patent
Jang et al.

(10) Patent No.: US 12,500,130 B2
(45) Date of Patent: Dec. 16, 2025

(54) METHOD OF MANUFACTURE OF FAN-OUT TYPE SEMICONDUCTOR PACKAGE

(71) Applicant: SAMSUNG ELECTRONICS CO., LTD., Suwon-si (KR)

(72) Inventors: Sehoon Jang, Hwaseong-si (KR); Sangkyu Lee, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 576 days.

(21) Appl. No.: 17/953,092

(22) Filed: Sep. 26, 2022

(65) Prior Publication Data
US 2023/0223309 A1    Jul. 13, 2023

(30) Foreign Application Priority Data
Jan. 7, 2022  (KR) ..................... 10-2022-0002961

(51) Int. Cl.
| H01L 21/00 | (2006.01) |
| H01L 21/48 | (2006.01) |
| H01L 21/56 | (2006.01) |
| H01L 23/29 | (2006.01) |
| H01L 23/00 | (2006.01) |

(52) U.S. Cl.
CPC ........ *H01L 23/295* (2013.01); *H01L 21/4853* (2013.01); *H01L 21/4857* (2013.01); *H01L 21/56* (2013.01); *H01L 23/293* (2013.01); *H01L 24/73* (2013.01); *H01L 24/92* (2013.01); *H01L 2224/73204* (2013.01); *H01L 2224/92125* (2013.01)

(58) Field of Classification Search
None
See application file for complete search history.

(56) References Cited

U.S. PATENT DOCUMENTS

| 5,907,190 | A | 5/1999 | Ishikawa et al. |
| 8,097,490 | B1* | 1/2012 | Pagaila ............... H01L 23/5386 |
| | | | 438/618 |
| 9,147,629 | B2 | 9/2015 | Chen et al. |
| 9,418,907 | B2 | 8/2016 | Usami |
| 10,199,331 | B2* | 2/2019 | Lee ......................... H01L 21/56 |
| 10,276,467 | B2 | 4/2019 | Kim et al. |
| 10,403,582 | B2 | 9/2019 | Kawabata |
| 11,069,588 | B2 | 7/2021 | Oh et al. |
| 2010/0140772 | A1* | 6/2010 | Lin ....................... H01L 23/147 |
| | | | 257/E21.597 |

(Continued)

FOREIGN PATENT DOCUMENTS

KR    10-1933277    12/2018

*Primary Examiner* — Nicholas J Tobergte
(74) *Attorney, Agent, or Firm* — Fish & Richardson P.C.

(57) ABSTRACT

A method of manufacture for a semiconductor package includes; forming a first wiring structure, connecting a semiconductor chip to the first wiring structure, forming a lower encapsulant on the first wiring structure to cover at least a portion of a lateral surface of the semiconductor chip, wherein the lower encapsulant does not cover an upper surface of the semiconductor chip, forming an upper encapsulant on the lower encapsulant, wherein the upper encapsulant covers the upper surface of the semiconductor chip and the upper encapsulant has a materially different composition than the lower encapsulant, and forming a second wiring structure on the upper encapsulant.

20 Claims, 29 Drawing Sheets

(56) References Cited

U.S. PATENT DOCUMENTS

| | | | |
|---|---|---|---|
| 2012/0187568 A1* | 7/2012 | Lin | H01L 23/28 |
| | | | 257/E23.174 |
| 2014/0070424 A1* | 3/2014 | Chuang | H01L 24/17 |
| | | | 257/774 |
| 2014/0264928 A1* | 9/2014 | Lin | H01L 23/49833 |
| | | | 438/126 |
| 2014/0284785 A1* | 9/2014 | Sung | H01L 23/3135 |
| | | | 438/109 |
| 2015/0279818 A1* | 10/2015 | Hsu | H01L 21/4853 |
| | | | 257/737 |
| 2015/0303174 A1* | 10/2015 | Yu | H01L 21/565 |
| | | | 438/109 |
| 2016/0260684 A1* | 9/2016 | Zhai | H01L 25/0652 |
| 2017/0103905 A1* | 4/2017 | Oratti Kalandar | H01L 21/78 |
| 2019/0164862 A1* | 5/2019 | Kim | H01L 23/3142 |
| 2019/0214347 A1* | 7/2019 | Huang | H01L 24/92 |
| 2020/0365571 A1 | 11/2020 | Chen et al. | |

* cited by examiner

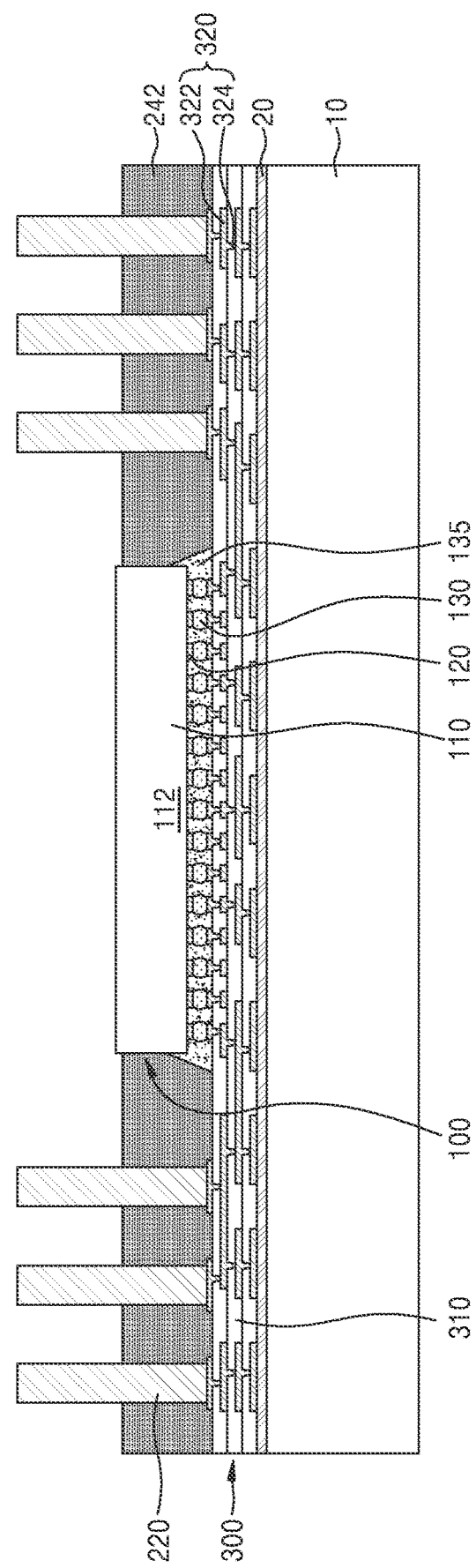

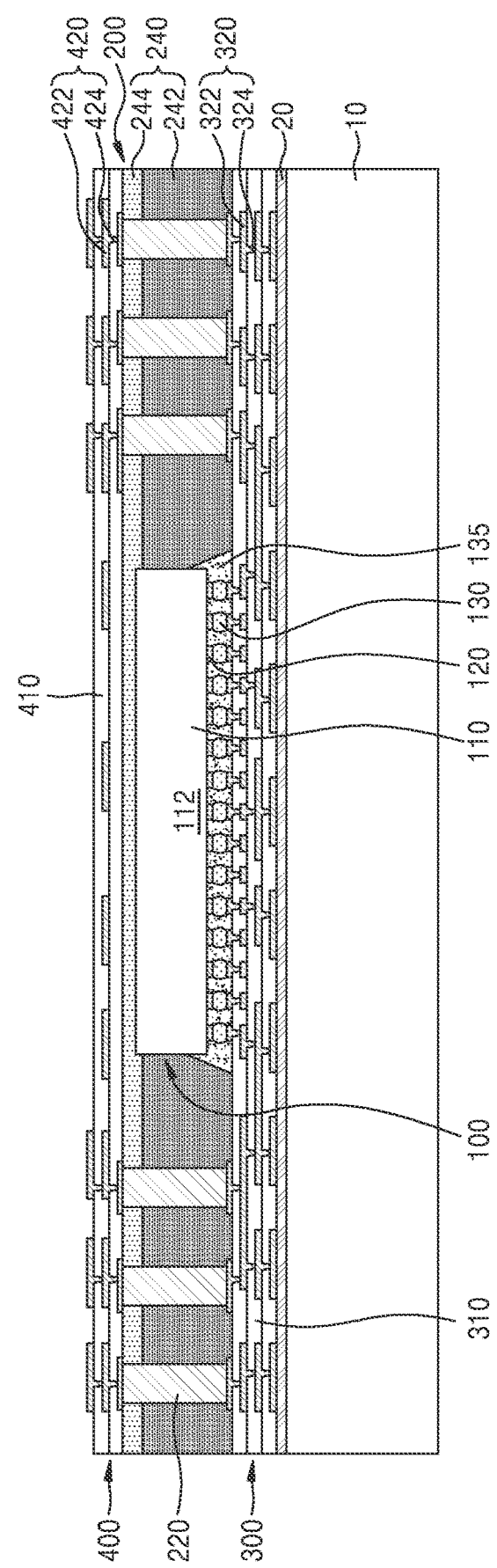

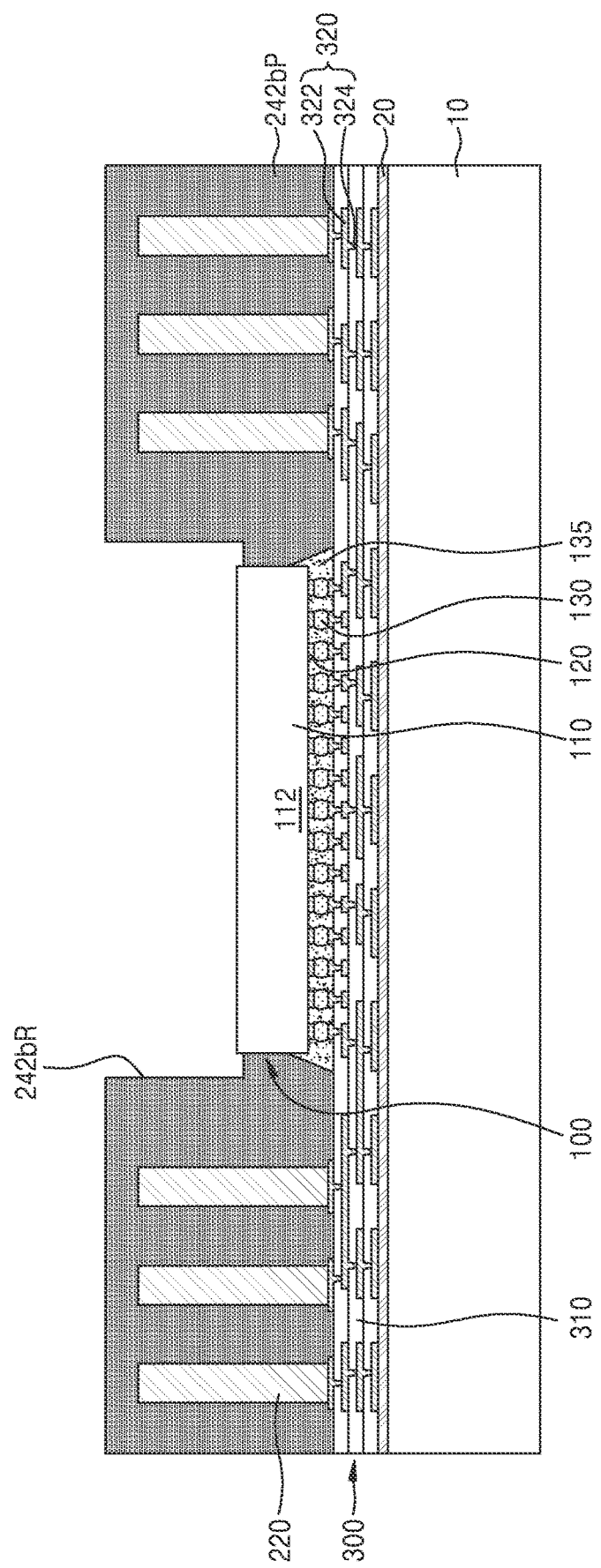

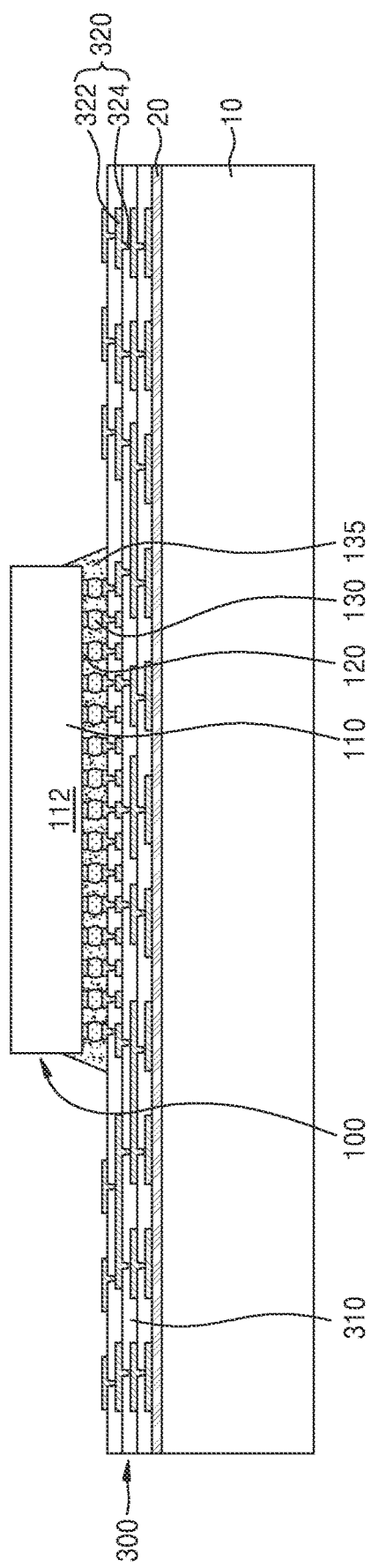

METHOD OF MANUFACTURE OF FAN-OUT TYPE SEMICONDUCTOR PACKAGE

CROSS-REFERENCE TO RELATED APPLICATION

This application claims priority under 35 U.S.C. § 119 to Korean Patent Application No. 10-2022-0002961 filed on Jan. 7, 2022 in the Korean Intellectual Property Office, the subject matter of which is hereby incorporated by reference in its entirety.

BACKGROUND

The inventive concept relates generally to methods of manufacture for semiconductor packages, and more particularly, to methods of manufacture for fan-out type semiconductor packages.

Continuing evolution of electronic devices and related technologies in response to expanding user demands is characterized by decreasing physical size, increasing data storage and computational capabilities, and expanding functionalization. Driven by these trends, contemporary and emerging semiconductor packages provide an increasing number of connection terminals (e.g., input/output (or I/O) terminals). And in order to reduce or prevent interference between proximate connection terminals, certain semiconductor packages have adopted a so-called "fan-out" design, and are generally referred to as fan-out type semiconductor packages.

SUMMARY

Embodiments of the inventive concept provide methods of manufacturing fan-out type semiconductor packages exhibiting improved structural reliability.

According to an aspect of the inventive concept, there is provided a method of manufacture for a semiconductor package, the method including; forming a first wiring structure, connecting a semiconductor chip to the first wiring structure, forming a lower encapsulant on the first wiring structure to cover at least a portion of a lateral surface of the semiconductor chip, wherein the lower encapsulant does not cover an upper surface of the semiconductor chip, forming an upper encapsulant on the lower encapsulant, wherein the upper encapsulant covers the upper surface of the semiconductor chip and the upper encapsulant has a materially different composition than the lower encapsulant, and forming a second wiring structure on the upper encapsulant.

According to an aspect of the inventive concept, there is provided a method of manufacture for a semiconductor package, the method including; forming a first wiring structure including first redistribution patterns, electrically connecting a semiconductor chip to the first wiring structure, forming a lower encapsulant including first filler on the first wiring structure, wherein the lower encapsulant covers at least a portion of a lateral surface of the semiconductor chip and does not cover an upper surface of the semiconductor chip, forming an upper encapsulant including second filler on the lower encapsulant, wherein the upper encapsulant covers the upper surface of the semiconductor chip, and forming a second wiring structure including second redistribution patterns on the upper encapsulant, wherein the second filler has an average diameter less than that of the first filler, or the second filler has a proportion lower than that of first filler.

According to an aspect of the inventive concept, there is provided a method of manufacture for a semiconductor package, the method including; forming a first wiring structure; electrically connecting a semiconductor chip to the first wiring structure, forming a lower encapsulant including first filler having a first average diameter on the first wiring structure to cover an upper surface of the first wiring structure and at least a portion of a lateral surface of the semiconductor chip, wherein an upper surface of the lower encapsulant is disposed at a level equal to or lower than that of an upper surface of the semiconductor chip, forming a preliminary upper encapsulant on the lower encapsulant and the semiconductor chip, wherein the preliminary upper encapsulant includes second filler having a second average diameter less than the first average diameter of the first filler, forming through-holes through the preliminary upper encapsulant and the lower encapsulant, forming connection structures to respectively fill the through-holes, wherein the connection structures electrically connect to the first wiring structure, removing an upper portion of the preliminary upper encapsulant to form an upper encapsulant and forming a second wiring structure on the upper encapsulant.

BRIEF DESCRIPTION OF THE DRAWINGS

Advantages, benefits and features, as well as the making and use of the inventive concept may be clearly understood upon consideration of the following detailed description together with the accompanying drawings, in which:

FIGS. 6A, 6B, 6C, 6D, 6E, 6F, 6G and 6H (hereafter collectively, "FIGS. 6A to 6H") are related cross-sectional views illustrating a method of manufacture for a semiconductor package according to embodiments of the inventive concept;

FIGS. 7A, 7B and 7C (hereafter collectively, "FIGS. 7A to 7C") are related cross-sectional views illustrating a method of manufacture for a semiconductor package according to embodiments of the inventive concept;

DETAILED DESCRIPTION

Throughout the written description and drawings, like reference numbers and labels are used to denote like or similar elements, components, features and/or method step(s). Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
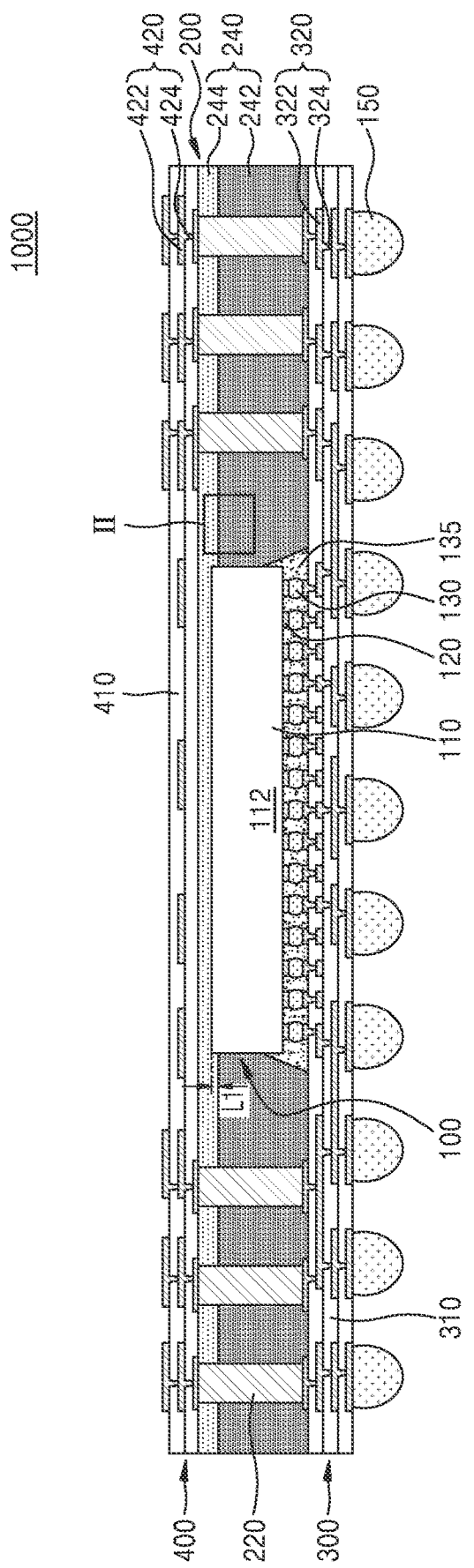
FIG. 1 is a cross-sectional view of a semiconductor package according to embodiments of the inventive concept.

FIG. 1 is a cross-sectional view of a semiconductor package 1000 according to embodiments of the inventive concept.

Referring to FIG. 1, the semiconductor package 1000 may include a first wiring structure 300, at least one semiconductor chip 100 disposed on the first wiring structure 300, a second wiring structure 400 disposed over the at least one semiconductor chip 100, an encapsulant 240 filling a space between the first wiring structure 300 and the second wiring structure 400, and connection structures 220 (including, respectively, an upper portion 200). Here, the connection structures 220 may be used to respectively, variously and electrically connect the first wiring structure 300 and the second wiring structure 400 through the encapsulant 240. In some embodiments, the semiconductor package 1000 may be a fan-out type semiconductor package in which a first footprint (e.g., a horizontal width and/or a horizontal area) of the first wiring structure 300 is greater than a second footprint of the at least one semiconductor chip 100. In some embodiments, the semiconductor package 1000 may include a fan-out type wafer level package (FOWLP) or a fan-out type panel level package (FOPLP).

Here, at least one of the first wiring structure 300 and the second wiring structure 400 may be constitute a redistribution pattern. Accordingly, the first wiring structure 300 and/or the second wiring structure 400 may be formed by redistribution processes, however, the inventive concept is not limited thereto. For example, in some embodiments, at least one of the first wiring structure 300 and the second wiring structure 400 may include a printed circuit board (PCB). In this regard, the first wiring structure 300 and the second wiring structure 400 may be respectively referred to as a first redistribution structure and a second redistribution structure, or as a lower redistribution structure and an upper redistribution structure.

The first wiring structure 300 may include first redistribution insulating layer(s) 310 substantially surrounding (or at least partially encompassing) first redistribution pattern(s) 320. Thus, in some embodiments, the first wiring structure 300 may include multiple, vertically stacked, first redistribution insulating layers 310. Here, each first redistribution insulating layer 310 may include (e.g., be formed form) a photo-imageable dielectric (PID) or a photosensitive polyimide (PSPI). In some embodiments, the first wiring structure 300 may have a thickness ranging from about 30 μm to about 50 μm.

The first redistribution pattern(s) 320 may include at least one first redistribution line pattern 322 and at least one first redistribution via 324. The first redistribution patterns 320, variously including first redistribution line pattern(s) 322 and/or first redistribution via(s) 324, may include for example; at least one metal, such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), and ruthenium (Ru). In some embodiments, the first redistribution patterns 320 may be formed by vertically stacking metal(s) on a seed layer including for example; Ti, titanium nitride (TiN), or titanium tungsten (TiW).

The first redistribution line patterns 322 may be disposed on at least one of upper and lower surfaces of the first redistribution insulating layer 310. For example, when the first wiring structure 300 includes vertically stacked first redistribution insulating layers 310, the first redistribution line patterns 322 may be arranged in at least a portion of an upper-surface region of an uppermost first redistribution insulating layer 310, a lower surface of a lowermost first redistribution insulating layer 310, and a region between two adjacent first redistribution insulating layers 310 from among the first redistribution insulating layers 310. Some of the first redistribution line patterns 322 may be disposed on the upper surface of the first wiring structure 300, and may be referred to as first upper-surface connection pads. Some of the first redistribution line patterns 322 may be disposed on the lower surface of the first wiring structure 300, and may be referred to as first lower-surface connection pads.

Chip connection members 130 may be respectively connected to at least some of the first upper-surface connection pads, and the connection structures 220 may be respectively connected to some others of the first upper-surface connection pads.

External connection terminals 150 may be respectively connected to the first lower-surface connection pads, wherein the external connection terminals 150 may be used to variously connect the semiconductor package 1000 with one or more external circuits. In some embodiments, each of the external connection terminals 150 may include at least one of a bump, a solder ball, etc. In some embodiments, each external connection terminal 150 may have a height ranging from about 100 μm to about 180 μm.

The first redistribution vias 324 may respectively contact and be connected to at least one of the first redistribution line patterns 322 through the first redistribution insulating layer 310. In some embodiments, at least some of the first redistribution line patterns 322 may be integrally and respectively formed in relation to some of the first redistribution vias 324. For example, a first redistribution line pattern 322 may be integrally formed in conjunction with a first redistribution via 324 contacting a lower surface of the first redistribution line pattern 322.

In some embodiments, the first redistribution vias 324 may have a vertically tapered shape characterized by an increasing horizontal width from bottom to top. That is, a width of each first redistribution via 324 may increase as the first redistribution via 324 extends towards the at least one semiconductor chip 100.

The semiconductor chip 100 may include a semiconductor substrate 110 having an active surface and an opposing inactive surface, a semiconductor device 112 formed on the active surface of the semiconductor substrate 110, and a number of chip pads 120 variously arranged on a first surface of the semiconductor chip 100. In some embodiments, the semiconductor chip 100 may have a thickness ranging from about 70 μm to about 120 μm.

Here, the first surface of the semiconductor chip 100 opposes a second surface of the semiconductor chip 100, wherein the second surface of the semiconductor chip 100 may be the inactive surface of the semiconductor substrate 110. Because the active surface of the semiconductor substrate 110 is very close to the first surface of the semiconductor chip 100, the active surface of the semiconductor substrate 110 and the first surface of the semiconductor chip 100 are illustrated in FIG. 1 without visual distinction.

In some embodiments, the semiconductor chip 100 may have a face-down arrangement, in which the first surface of the semiconductor chip 100 faces toward the first wiring structure 300, and may be connected to the upper surface of the first wiring structure 300. In this regard, the first surface of the semiconductor chip 100 may be referred to as a lower surface of the semiconductor chip 100, and the second surface of the semiconductor chip 100 may be referred to as an upper surface of the semiconductor chip 100.

The chip connection members 130 may be variously and respectively disposed between the chip pads 120 and the first upper-surface connection pads of the first wiring structure 300. In some embodiments, each chip connection member 130 may include a solder ball or a micro-bump. The semiconductor chip 100 may be electrically connected to the first redistribution patterns 320 of the first wiring structure 300 through the chip connection members 130.

In some embodiments, an underfill layer 135 may be disposed between the semiconductor chip 100 and the first wiring structure 300, such that the underfill layer 135 substantially surrounds the chip connection members 130. Here, the underfill layer 135 may include, for example an epoxy resin introduced using a capillary underfill method. In some embodiments, the underfill layer 135 may include a non-conductive film (NCF).

The semiconductor substrate 110 may include, for example, a semiconductor material, such as silicon (Si) or germanium (Ge). Alternately, the semiconductor substrate 110 may include a compound semiconductor material, such as silicon carbide (SiC), gallium arsenide (GaAs), indium arsenide (InAs), and indium phosphide (InP). The semiconductor substrate 110 may include conductive region(s), such as impurity-doped well(s). The semiconductor substrate 110 may include various device isolation structures, such as shallow trench isolation (STI) structure(s).

The semiconductor device 112 including one or more individual devices of various type may be formed on the active surface of the semiconductor substrate 110. The individual devices may include various microelectronic devices, such as for example, a metal-oxide-semiconductor field effect transistor (MOSFET) (e.g., a complementary metal-oxide-semiconductor (CMOS) transistor), a system large-scale integration (LSI), an active element, a passive element, etc. At least one of the individual devices may be electrically connected to one or more conductive region(s) of the semiconductor substrate 110. The semiconductor device 112 may further include a conductive wiring line or a conductive plug which electrically interconnects at least two of the individual devices, or electrically connects at least one of the individual devices to conductive region(s) of the semiconductor substrate 110. Alternately or additionally, at least one of the individual devices may be electrically isolated (e.g., using an insulating film) from other, proximately-disposed individual devices.

In some embodiments, the semiconductor chip 100 may include at least one of a central processing unit (CPU) chip, a graphics processing unit (GPU) chip, an application processor (AP), and a memory chip. Here, the memory chip may include, at least one of, for example, a non-volatile memory semiconductor chip, such as flash memory, phase-change random access memory (PRAM), magneto-resistive random access memory (MRAM), ferroelectric random access memory (FeRAM), or resistive random access memory (RRAM). The flash memory may include, for example, NAND flash memory or V-NAND flash memory. In some embodiments, the semiconductor chip 100 may include a volatile memory semiconductor chip, such as dynamic random access memory (DRAM) or static random access memory (SRAM).

The encapsulant 240 may be disposed on the upper surface of the first wiring structure 300 to substantially surround the semiconductor chip 100. In this regard, the encapsulant 240 may substantially fill a space between the first wiring structure 300 and the second wiring structure 400.

In some embodiments, the encapsulant 240 may fill a space between the lower surface of the semiconductor chip 100 and the upper surface of the first wiring structure 300 and substantially surround the chip connection members 130. In this case, the underfill layer 135 may be omitted. In some embodiments, the encapsulant 240 may have a thickness ranging from about 150 µm to about 200 µm. The encapsulant 240 may include a molding member including an epoxy mold compound (EMC).

Further in this regard, the encapsulant 240 of FIG. 1 may be variously implemented. (See, for example, encapsulants 240-1, 240-2, 240-3, and 240-4 of FIGS. 2A to 2D).

The encapsulant 240 may include a lower encapsulant 242 and an upper encapsulant 244, wherein the upper encapsulant 244 is disposed on the lower encapsulant 242. That is, the encapsulant 240 may be understood as a stacked structure including the lower encapsulant 242 and the upper encapsulant 244 stacked on the lower encapsulant 242. Further, in some embodiments, the upper encapsulant 244 may be materially different composition than the lower encapsulant 242. In this regard, the term "materially different composition" may denote one or more differences between the upper encapsulant 244 and the lower encapsulant 242 related to constituent material(s), presence of absence of filler, filler type(s), filler proportion(s), material thickness(es), etc.

The lower encapsulant 242 may cover the upper surface of the first wiring structure 300 and at least a portion of a lateral surface of the semiconductor chip 100 and may substantially surround lower portions of the connection structures 220. However, the lower encapsulant 242 may not cover the upper surface of the semiconductor chip 100. In some embodiments, the lower encapsulant 242 may fill a space between the lower surface of the semiconductor chip 100 and the upper surface of the first wiring structure 300, and substantially surround the chip connection members 130. In this case, the underfill layer 135 may be omitted. In some embodiments, the lower encapsulant 242 may have a thickness ranging from about 90 µm to about 170 µm.

The upper encapsulant 244 may substantially surround an upper surface of the lower encapsulant 242, the upper surface of the semiconductor chip 100, and upper portions of the connection structures 220. Here, a thickness of the lower encapsulant 242 may be greater than a thickness of the upper encapsulant 244. For example, the upper encapsulant 244 may have a thickness ranging from about 35 µm to about 70 µm, wherein a portion of the upper encapsulant 244 covering the upper surface of the semiconductor chip 100 may have a thickness ranging from about 30 µm to about 60 µm.

In some embodiments, the upper surface of the lower encapsulant 242 may be disposed at a lower "level" (e.g., as vertically measured in relation to an arbitrary horizontal surface, such as an upper surface of the first wiring structure 300) than that of the upper surface of the semiconductor chip 100. In this case, the lower encapsulant 242 may cover a lower lateral surface of the semiconductor chip 100, and the upper encapsulant 244 may cover an upper lateral surface of the semiconductor chip 100. Here, for example, a level difference 'L1' between the upper surface of the lower encapsulant 242 and the upper surface of the semiconductor chip 100 may range from between about 5 µm to about 10 µm.

Further in this regard, the lower encapsulant 242 may include (first) filler. And although the upper encapsulant 244 may include (second) filler, some embodiments may omit filler.

The filler may include, for example, a ceramic-based material having non-conductive insulating properties. In some embodiments, the filler may include at least one of AlN, BN, $Al_2O_3$, SiC, and MgO. For example, filler may include a silica filler or an alumina filler. For example, the lower encapsulant 242 and the upper encapsulant 244 may each include an epoxy-based material including filler. Alternately, for example, the lower encapsulant 242 may include an epoxy-based material including filler, and the upper encapsulant 244 may include an epoxy-based material not including filler. An average diameter of the filler included in the lower encapsulant 242 may be greater than or equal to an average diameter of the filler included in the upper encapsulant 244. A proportion of the filler included in the lower encapsulant 242 may be higher than a proportion of the filler included in the upper encapsulant 244. The average diameter of filler included in the lower encapsulant 242 may range from between about 15 µm to about 50 µm. In some embodiments, the average diameter of the filler included in the upper encapsulant 244 may be zero, if the upper encapsulant 244 includes no filler. Alternately, the average diameter of filler included in the upper encapsulant 244 may range from between about 3 µm to about 45 µm. A proportion of filler included in the lower encapsulant 242 may range from between about 60% by weight to about 90% by weight. In some more specific embodiments, a proportion of the filler included in the upper encapsulant 244 may be about 80 t % by weight or less.

Recognizing that the upper encapsulant 244 may not include filler, filler included in the upper encapsulant 244 may have an average diameter that is less than an average diameter of filler included in the lower encapsulant 242. Alternately or additionally, filler proportion included in the upper encapsulant 244 may be lower (or less) than a proportion of filler included in the lower encapsulant 242.

In this regard, the proportion and average diameter of filler included in the lower encapsulant 242 may be respectively referred to as a first proportion and a first average diameter, whereas the proportion and average diameter of filler included in the upper encapsulant 244 may be respectively referred to as a second proportion and a second average diameter.

A coefficient of thermal expansion (CTE) of the upper encapsulant 244 may be greater than a CTE of the lower encapsulant 242. For example, the CTE of the upper encapsulant 244 may range from between about 20 ppm/° C. to about 70 ppm/° C., whereas and CTE of the lower encapsulant 242 may range from between about 5 ppm/° C. to about 25 ppm/° C. Here, the CTE of the lower encapsulant 242 may be referred to as a first CTE, and the CTE of the upper encapsulant 244 may be referred to as a second CTE.

The connection structures 220 may be used to electrically connect the first wiring structure 300 and the second wiring structure 400 through the encapsulant 240. Thus, lower surfaces of the connection structures 220 may respectively contact the first upper-surface connection pads of the first wiring structure 300 in order to electrically connect to the first redistribution patterns 320. Upper surfaces of the connection structures 220 may contact the second lower-surface connection pads of the second wiring structure 400 in order to electrically connect the second redistribution patterns 420. In some embodiments, each of the plurality of connection structures 220 may have a substantially equal horizontal width and may extend in a vertical direction. For example, each of the plurality of connection structures 220 may have a height ranging from between about 150 µm to about 200 µm.

Each of the connection structures 220 may include a conductive column, a through-mold via (TMV), a conductive solder, or a conductive pillar. In some embodiments, each of the connection structures 220 may include a post including copper (Cu) or an copper alloy. The upper surfaces of the connection structures 220 and the upper surface of the upper encapsulant 244 may be dispose at the same level (i.e., may be vertically coplanar).

The second wiring structure 400 may be disposed on the upper encapsulant 244 and the connection structures 220. The second wiring structure 400 may include a second redistribution insulating layer 410 and second redistribution patterns 420, wherein the second redistribution insulating layer 410 may substantially surround the second redistribution patterns 420. In some embodiments, a thickness of the second wiring structure 400 may be less than a thickness of the first wiring structure 300. For example, the second wiring structure 400 may have a thickness ranging from between about 20 µm to about 40 µm. Here, the thickness of the first wiring structure 300 may be referred to as a first thickness, and the thickness of the second wiring structure 400 may be referred to as a second thickness.

In some embodiments, the second wiring structure 400 may include vertically-stacked second redistribution insulating layers 410. The second redistribution patterns 420 may include second redistribution line patterns 422 and second redistribution vias 424. The second redistribution line patterns 422 may be disposed on at least one of upper and lower surfaces of the second redistribution insulating layer 410. Some of the second redistribution line patterns 422, disposed on the upper surface of the second wiring structure 400 may be referred to as upper-surface connection pads, and some of the second redistribution line patterns 422 disposed on the lower surface of the second wiring structure 400 may be referred to as a plurality of second lower-surface connection pads. The connection structures 220 may be respectively and variously connected to the second lower-surface connection pads.

The second redistribution vias 424 may respectively contact and be connected at least some of the second redistribution line patterns 422 through at least one second redistribution insulating layer 410. In some embodiments, at least some of the second redistribution line patterns 422 may be respectively and integrally formed in relation to some of the second redistribution vias 424. For example, a second redistribution line pattern 422 may be integrally formed in relation to a second redistribution via 424 contacting a lower surface of the second redistribution line pattern 422.

In some embodiments, the second redistribution vias 424 may each have a vertically tapered shape characterized by an increasing horizontal width as the second redistribution via 424 extends from bottom to top. That is, the second redistribution vias 424 may each have a horizontal width that decrease as it extends towards the at least one semiconductor chip 100.

In some embodiments, when the semiconductor package 1000 may be a lower package of a package-on-package (PoP), wherein an upper package may be connected to the second upper-surface connection pads. For example, a plurality of package connection terminals may be respectively arranged between the upper package and the second upper-surface connection pads, and the upper package may include an auxiliary semiconductor chip, where in the auxiliary semiconductor chip may be at least one memory chip. Here, for example, the auxiliary semiconductor chip may include a DRAM chip, an SRAM chip, a flash memory chip, an EEPROM chip, a PRAM chip, an MRAM chip, and/or an RRAM chip.

Thus, the semiconductor package 1000 of FIG. 1 may include the encapsulant 240 including the lower encapsulant 242 and the upper encapsulant 244, wherein the upper encapsulant 244 may have a lesser thickness and a greater CTE than that of the lower encapsulant 242. Accordingly, the structural reliability of the semiconductor package 1000 may be generally improved while nonetheless reducing the overall thickness.

FIGS. 2A to 2D are respective, enlarged cross-sectional views illustrating a filling unit for a semiconductor package according to embodiments of the inventive concept. In this regard, FIGS. 2A to 2D may be understood as respective enlarged cross-sectional views of region 'II' indicated in FIG. 1.

Figure 2A:
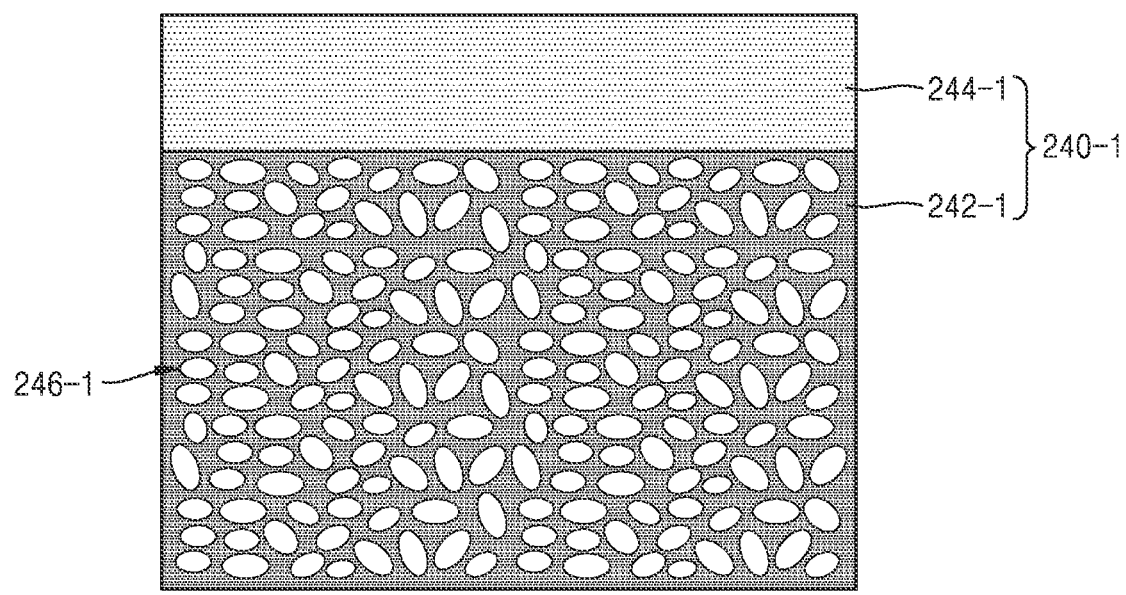
FIGS. 2A, 2B, 2C and 2D (hereafter collectively, "FIGS. 2A to 2D") are respective, enlarged cross-sectional views illustrating a filling unit of a semiconductor package according to embodiments of the inventive concept.

Referring to FIGS. 1 and 2A, the semiconductor package 1000 may include an encapsulant 240-1 including a lower encapsulant 242-1 and an upper encapsulant 244-1. That is, the upper encapsulant 244-1 may be disposed on the lower encapsulant 242-1, or vertically stacked on the upper encapsulant 244-1.

The lower encapsulant 242-1 may include filler, but the upper encapsulant 244-1 may or may not include filler. The filler included in the lower encapsulant 242-1 may be referred to as a lower filler 246-1. For example, the lower filler 246-1 may include a ceramic-based material having non-conductive insulating properties. In some embodiments, the lower filler 246-1 may include at least one of AlN, BN, $Al_2O_3$, SiC, and MgO. For example, the lower filler 246-1 may include a silica filler or an alumina filler. For example, the lower encapsulant 242-1 may include an epoxy-based material including the lower filler 246-1. The upper encapsulant 244-1 may include an epoxy-based material including no filler. An average diameter of the lower filler 246-1 included in the lower encapsulant 242-1 may range from between about 15 µm to about 50 µm. A proportion of the lower filler 246-1 included in the lower encapsulant 242-1 may range from between about 60% by weight to about 90% by weight.

Figure 2B:
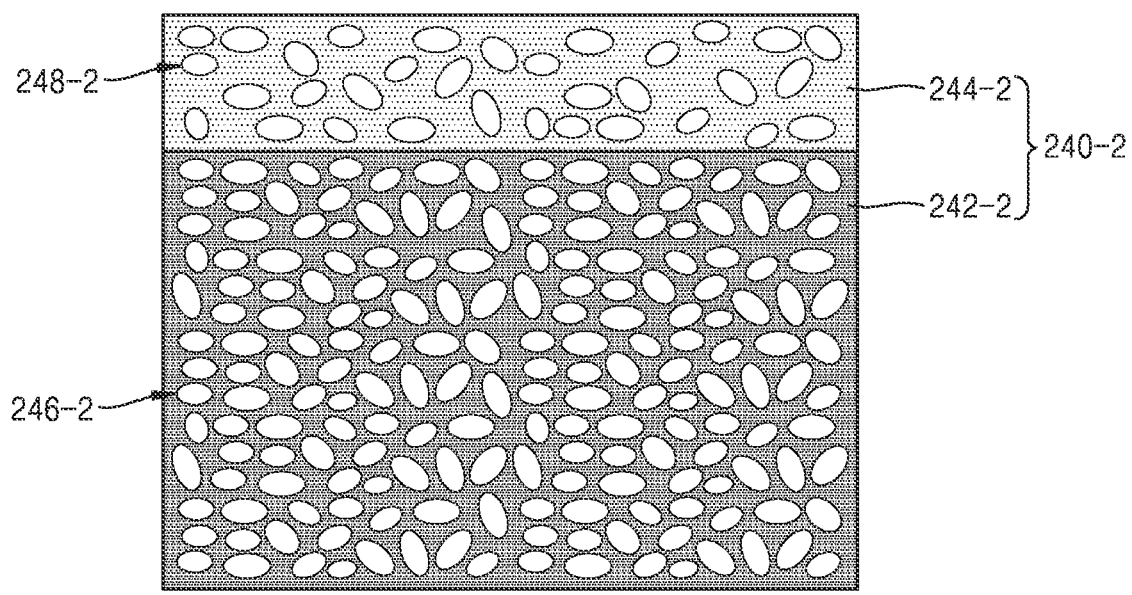

Referring to FIGS. 1 and 2B, the semiconductor package 1000 may include an encapsulant 240-2 I including a lower encapsulant 242-2 and an upper encapsulant 244-2. Here, the upper encapsulant 244-2 may be disposed on (or vertically stacked on) the lower encapsulant 242-2.

The lower encapsulant 242-2 and the upper encapsulant 244-2 may each include filler, wherein the filler included in the lower encapsulant 242-2 may be referred to as a lower filler 246-2, and the filler included in the upper encapsulant 244-2 may be referred to as an upper filler 248-2. The lower filler 246-2 and the upper filler 248-2 may each include a ceramic-based material having non-conductive insulating properties. In some embodiments, the lower filler 246-2 and the upper filler 248-2 may each include at least one of AlN, BN, $Al_2O_3$, SiC, and MgO. For example, the lower filler 246-2 and the upper filler 248-2 may each include a silica filler or an alumina filler. For example, the lower encapsulant 242-2 may include an epoxy-based material including the lower filler 246-2. The upper encapsulant 244-2 may include an epoxy-based material including the upper filler 248-2. An average diameter of the lower filler 246-2 included in the lower encapsulant 242-2 may be substantially equal to or slightly greater than an average diameter of the upper filler 248-2 included in the upper encapsulant 244-2. The average diameter of the lower filler 246-2 included in the lower encapsulant 242-2 may be about 15 µm to about 50 µm. The average diameter of the upper filler 248-2 included in the upper encapsulant 244-2 may range from between about 15 µm to about 45 µm. A proportion of the lower filler 246-2 included in the lower encapsulant 242-2 may be higher than a proportion of the upper filler 248-2 included in the upper encapsulant 244-2. The proportion of the lower filler 246-2 included in the lower encapsulant 242-2 may be equal to or greater than about 80% by weight, and the proportion of the upper filler 248-2 included in the upper encapsulant 244-2 may be less than about 80% by weight. For example, the proportion of the lower filler 246-2 included in the lower encapsulant 242-2 may range from between about 80% by weight to about 90 t % by weight. The proportion of the upper filler 248-2 included in the upper encapsulant 244-2 may be equal to or greater than about 1% by weight and less than about 80% by weight.

Figure 2C:
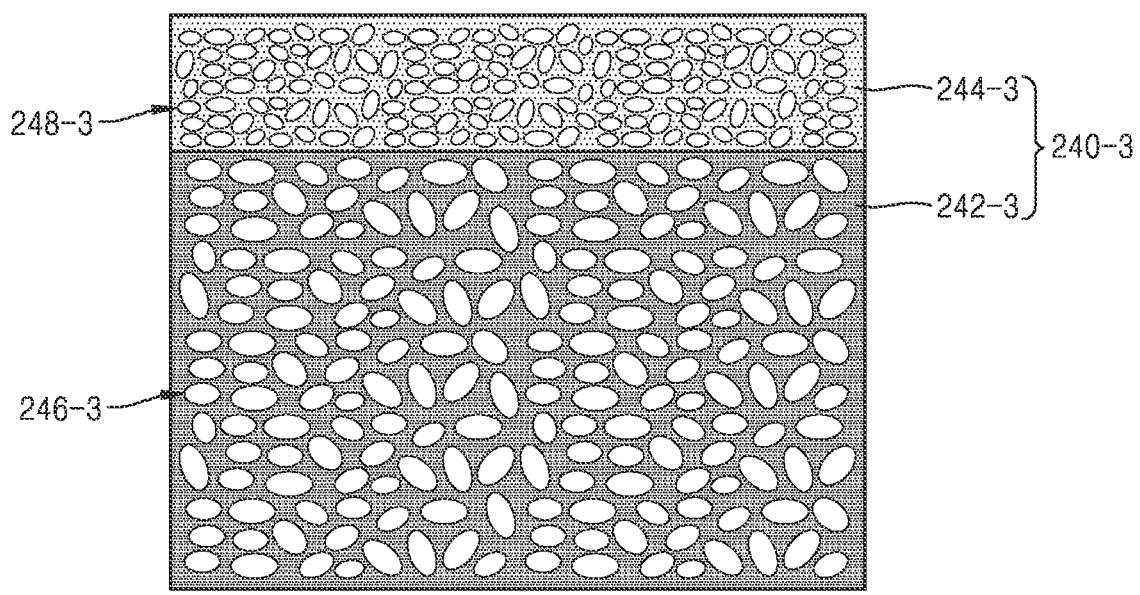

Referring to FIGS. 1 and 2C, the semiconductor package 1000 may include an encapsulant 240-3 including a lower encapsulant 242-3 and an upper encapsulant 244-3. The upper encapsulant 244-3 may be disposed on (or vertically stacked on) the lower encapsulant 242-3.

The lower encapsulant 242-3 and the upper encapsulant 244-3 may each include filler. The filler included in the lower encapsulant 242-3 may be referred to as a lower filler 246-3, and the filler included in the upper encapsulant 244-3 may be referred to as an upper filler 248-3. The lower filler 246-3 and the upper filler 248-3 may each include a ceramic-based material having non-conductive insulating properties. In some embodiments, the lower filler 246-3 and the upper filler 248-3 may each include at least one of AlN, BN, $Al_2O_3$, SiC, and MgO. For example, the lower filler 246-3 and the upper filler 248-3 may each include a silica filler or an alumina filler. For example, the lower encapsulant 242-3 may include an epoxy-based material including the lower filler 246-3. The upper encapsulant 244-3 may include an epoxy-based material including the upper filler 248-3. An average diameter of the lower filler 246-3 included in the lower encapsulant 242-3 may be greater than an average diameter of the upper filler 248-3 included in the upper encapsulant 244-3. The average diameter of the lower filler 246-3 included in the lower encapsulant 242-3 may range from between about 15 µm to about 50 µm. The average diameter of the upper filler 248-3 included in the upper encapsulant 244-3 may range from between about 3 µm to about 30 µm. A proportion of the lower filler 246-3 included in the lower encapsulant 242-3 may be substantially equal to a proportion of the upper filler 248-3 included in the upper encapsulant 244-3. The proportion of the lower filler 246-3 included in the lower encapsulant 242-3 may range from between about 80% by weight to about 90% by weight. The proportion of the upper filler 248-3 included in the upper encapsulant 244-3 may range from between about 80% by weight to about 90% by weight.

Figure 2D:
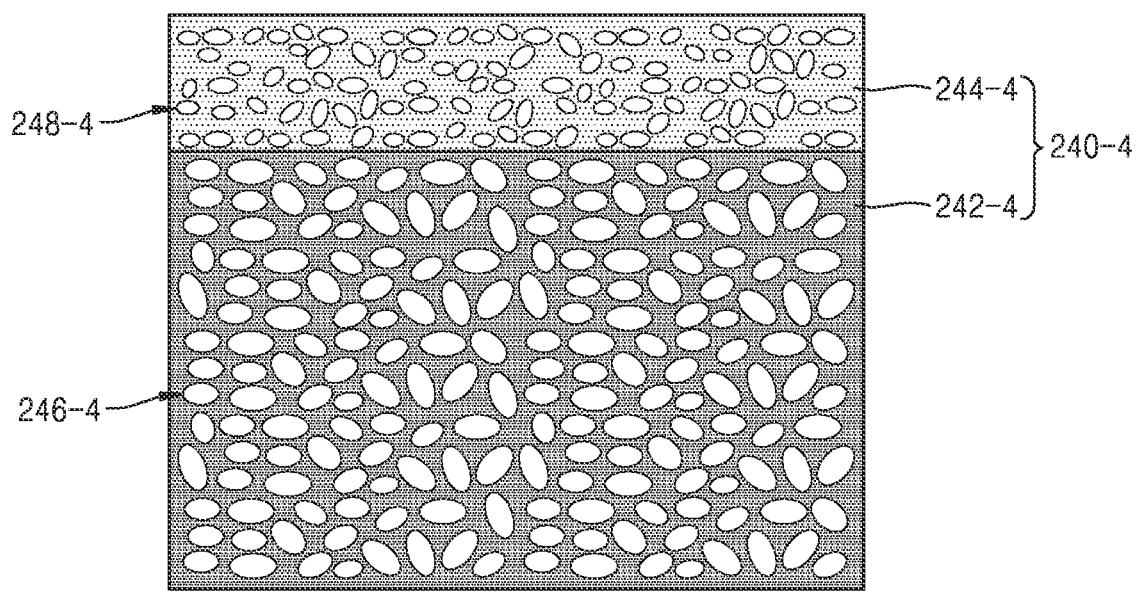

Referring to FIGS. 1 and 2D, the semiconductor package 1000 may include an encapsulant 240-4 including a lower encapsulant 242-4 and an upper encapsulant 244-4. The upper encapsulant 244-4 may be disposed on (or vertically stacked on) the lower encapsulant 242-4.

The lower encapsulant 242-4 and the upper encapsulant 244-4 may each include filler. The filler included in the lower encapsulant 242-4 may be referred to as a lower filler 246-4, and the filler included in the upper encapsulant 244-4 may be referred to as an upper filler 248-4. The lower filler 246-4 and the upper filler 248-4 may each include a ceramic-based material having non-conductive insulating properties. In some embodiments, the lower filler 246-4 and the upper filler 248-4 may each include at least one of AlN, BN, $Al_2O_3$, SiC, and MgO. For example, the lower filler 246-4 and the upper filler 248-4 may each include a silica filler or an alumina filler. For example, the lower encapsulant 242-4 may include an epoxy-based material including the lower filler 246-4. The upper encapsulant 244-4 may include an epoxy-based material including the upper filler 248-4. An average diameter of the lower filler 246-4 included in the lower encapsulant 242-4 may be greater than an average diameter of the upper filler 248-4 included in the upper encapsulant 244-4. The average diameter of the lower filler 246-4 included in the lower encapsulant 242-4 may range from between about 15 µm to about 50 µm. The average diameter of the upper filler 248-4 included in the upper encapsulant 244-4 may range from between about 3 µm to about 30 µm. A proportion of the lower filler 246-4 included in the lower encapsulant 242-4 may be higher than a proportion of the upper filler 248-4 included in the upper encapsulant 244-4. The proportion of the lower filler 246-4 included in the lower encapsulant 242-4 may range from between about 80% by weight to about 90% by weight. The proportion of the upper filler 248-4 included in the upper encapsulant 244-4 may range from between about 1% by weight to about 80% by weight.

Figure 3:
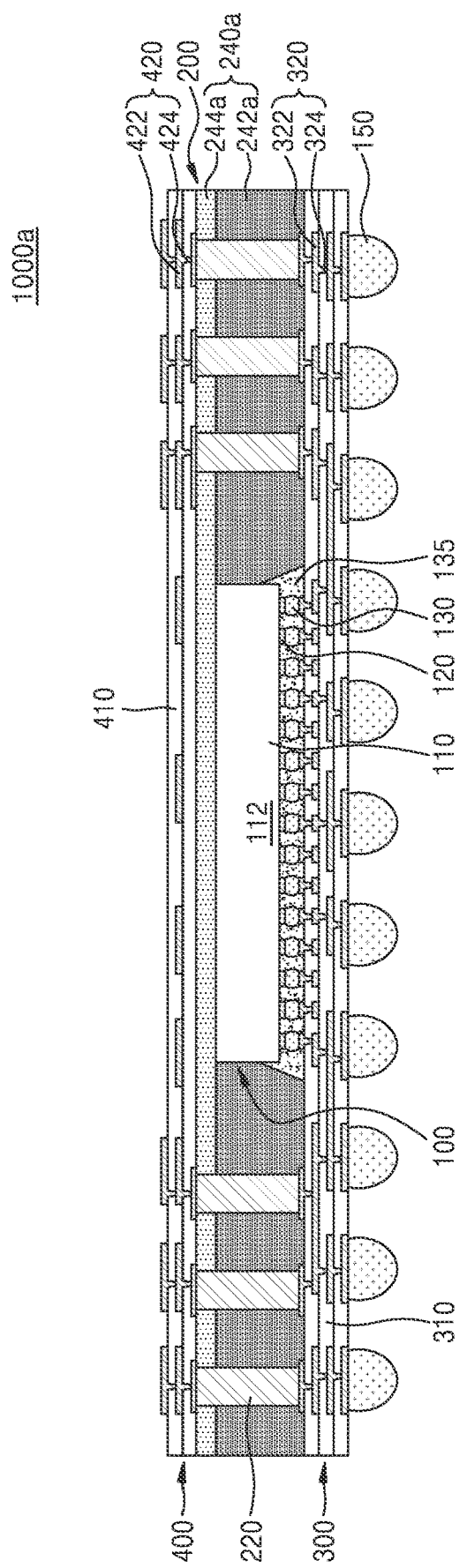
FIGS. 3, 4 and 5 are respective cross-sectional views of various semiconductor packages according to embodiments of the inventive concept.

FIG. 3 is a cross-sectional view of a semiconductor package 1000a according to embodiments of the inventive concept.

Referring to FIG. 3, the semiconductor package 1000a may include the first wiring structure 300, the at least one semiconductor chip 100 on the first wiring structure 300, the second wiring structure 400 on the at least one semiconductor chip 100, an encapsulant 240a filling the space between the first wiring structure 300 and the second wiring structure 400, and the connection structures 220 electrically connecting the first wiring structure 300 to the second wiring structure 400 through the encapsulant 240a.

The encapsulant 240a may be disposed on the upper surface of the first wiring structure 300 to substantially surround the semiconductor chip 100. The encapsulant 240a may fill the space between the first wiring structure 300 and the second wiring structure 400. Here, the encapsulant 240a may, for example, be one of the encapsulants 240-1, 240-2, 240-3, and 240-4 previously described in relation to FIGS. 2A to 2D.

The encapsulant 240a may include a lower encapsulant 242a and an upper encapsulant 244a, wherein the upper encapsulant 244a may be disposed on (or vertically stacked on) the lower encapsulant 242a.

The lower encapsulant 242a may cover the upper surface of the first wiring structure 300 and the entire lateral surface of the semiconductor chip 100 and may substantially surround lower portions of the connection structures 220. However, the lower encapsulant 242a may not cover the upper surface of the semiconductor chip 100. In some embodiments, the lower encapsulant 242a may fill the space between the lower surface of the semiconductor chip 100 and the upper surface of the first wiring structure 300 and substantially surround the chip connection members 130. In this case, the underfill layer 135 may be omitted.

The upper encapsulant 244a may substantially surround an upper surface of the lower encapsulant 242a, the upper surface of the semiconductor chip 100, and the upper portions of the connection structures 220. Here, a thickness of the lower encapsulant 242a may be greater than a thickness of the upper encapsulant 244a. In some embodiments, the upper surface of the lower encapsulant 242a may be disposed at the same level as the upper surface of the semiconductor chip 100.

Here, again, the lower encapsulant 242a may include filler, and the upper encapsulant 244a may or may not include filler. When filler is included in the upper encapsulant 244a, it may have an average diameter that is less than an average diameter of filler included in the lower encapsulant 242a, and/or filler included in the upper encapsulant 144a may have a proportion that is lower than a proportion of filler included in the lower encapsulant 242a. Further, a CTE of the upper encapsulant 244a may be greater than a CTE of the lower encapsulant 242a.

The connection structures 220 may electrically connect the first wiring structure 300 to the second wiring structure 400 through the encapsulant 240a. The lower surfaces of the connection structures 220 may respectively contact the first upper-surface connection pads of the first wiring structure 300, and the upper surfaces of the connection structures 220 may respectively contact the second lower-surface connection pads of the second wiring structure 400. The upper surfaces of the connection structures 220 and an upper surface of the upper encapsulant 244a may be disposed at the same level.

The second wiring structure 400 may be disposed on the upper encapsulant 244a and the connection structures 220. The second wiring structure 400 may include the second redistribution insulating layer 410 and the second redistribution patterns 420. The second redistribution patterns 420 may include the second redistribution line patterns 422 and the second redistribution vias 424.

Figure 4:
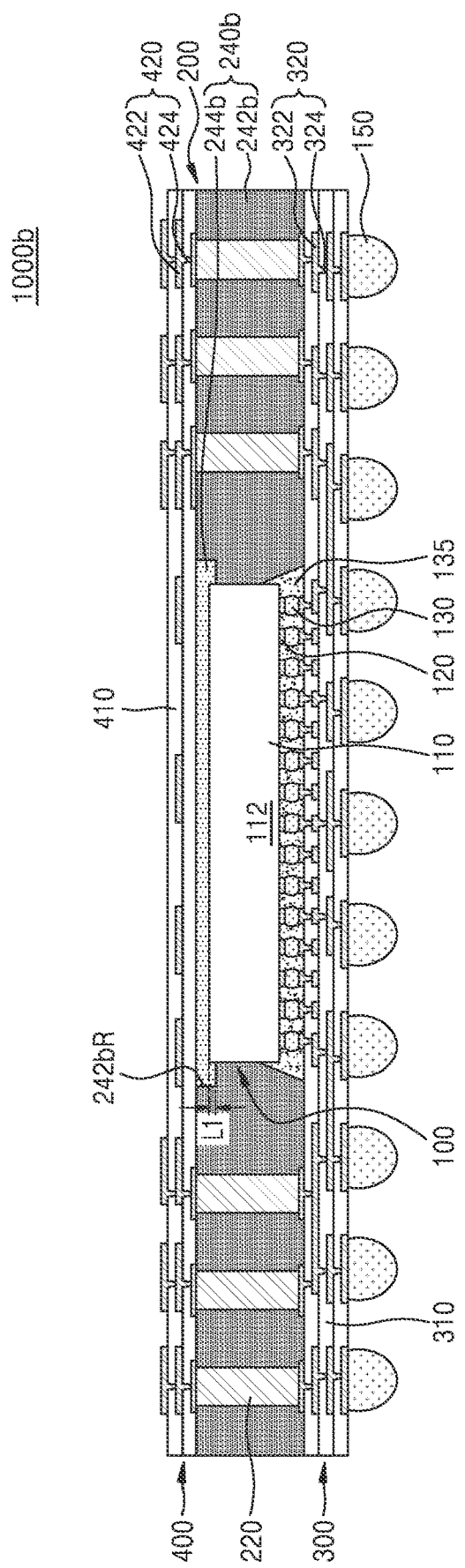

FIG. 4 is a cross-sectional view of a semiconductor package 1000b according to embodiments of the inventive concept.

Referring to FIG. 4, the semiconductor package 1000b may include the first wiring structure 300, the at least one semiconductor chip 100 on the first wiring structure 300, the second wiring structure 400 on the at least one semiconductor chip 100, an encapsulant 240b filling the space between the first wiring structure 300 and the second wiring structure 400, and the connection structures 220 electrically connecting the first wiring structure 300 to the second wiring structure 400 through the encapsulant 240b.

The first wiring structure 300 may include the first redistribution insulating layer 310 and the first redistribution patterns 320. The first redistribution patterns 320 may include the first redistribution line patterns 322 and the first redistribution vias 324.

The encapsulant 240b may be disposed on the upper surface of the first wiring structure 300 to substantially surround the semiconductor chip 100. The encapsulant 240b may fill the space between the first wiring structure 300 and the second wiring structure 400. Here, the encapsulant 240b may be, for example, one of the encapsulants 240-1, 240-2, 240-3, and 240-4 previously described in relation to FIGS. 2A to 2D.

The encapsulant 240b may include a lower encapsulant 242b and an upper encapsulant 244b, wherein the upper encapsulant 244b may be disposed on (or vertically stacked on) the lower encapsulant 242b.

The lower encapsulant 242b may cover the upper surface of the first wiring structure 300 and at least a portion of the lateral surface of the semiconductor chip 100 and substantially surround the connection structures 220. However, the lower encapsulant 242b may not cover the upper surface of the semiconductor chip 100. In some embodiments, the lower encapsulant 242b may fill the space between the lower surface of the semiconductor chip 100 and the upper surface of the first wiring structure 300 and substantially surround the chip connection members 130. In this case, the underfill layer 135 may be omitted.

An uppermost end of the lower encapsulant 242b may be disposed at a level higher than that of the upper surface of the semiconductor chip 100. The lower encapsulant 242b may have a recess space 242bR which extends downwardly from the uppermost end of the lower encapsulant 242b towards the upper surface of the semiconductor chip 100. In some embodiments, an upper lateral surface of the semiconductor chip 100 may be exposed by the recess space 242bR. In some embodiments, a lower surface of the recess space 242bR may be disposed at a lower level than the upper surface of the semiconductor chip 100.

The upper encapsulant 244b may fill the recess space 242bR of the lower encapsulant 242b. That is, the upper encapsulant 244b may substantially surround a surface of the lower encapsulant 242b in the recess space 242bR, the upper surface of the semiconductor chip 100, and the exposed upper lateral surface of the semiconductor chip 100. A thickness of the lower encapsulant 242b may be greater than a thickness of the upper encapsulant 244b.

The lower encapsulant 242b may include filler. Although the upper encapsulant 244b may include filler, the upper encapsulant 244b may or may not include filler. Recognizing that the upper encapsulant 244b may not include filler, it may include filler having an average diameter that is less than an average diameter of the filler included in the lower encapsulant 242b, or filler having a proportion that is lower than a proportion of the filler included in the lower encapsulant 242b. Further, the CTE of the upper encapsulant 244b may be greater than that of the lower encapsulant 242b.

The connection structures 220 may electrically connect the first wiring structure 300 and the second wiring structure 400 through the lower encapsulant 242b. The lower surfaces of the connection structures 220 may respectively contact the first upper-surface connection pads of the first wiring structure 300, and the upper surfaces of the connection structures 220 may respectively contact the second lower-surface connection pads of the second wiring structure 400. The upper surfaces of the connection structures 220, an upper surface of the uppermost end of the lower encapsulant 242b, and an upper surface of the upper encapsulant 244b may be disposed at the same level.

The second wiring structure 400 may be disposed on the lower encapsulant 242b, the upper encapsulant 244b, and the connection structures 220. The second wiring structure 400 may include the second redistribution insulating layer 410 and the second redistribution patterns 420. The second redistribution patterns 420 may include the second redistribution line patterns 422 and the second redistribution vias 424.

Figure 5:
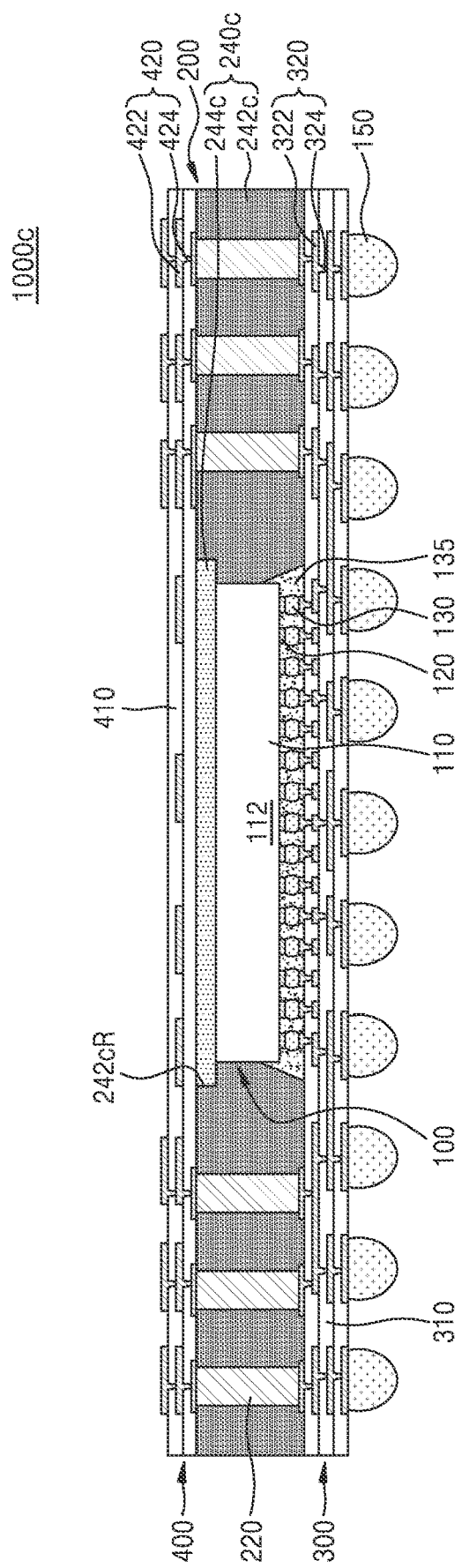

FIG. 5 is a cross-sectional view of a semiconductor package 1000c according to embodiments of the inventive concept.

Referring to FIG. 5, a semiconductor package 1000c may include the first wiring structure 300, the at least one semiconductor chip 100 on the first wiring structure 300, the second wiring structure 400 on the at least one semiconductor chip 100, an encapsulant 240c filling the space between the first wiring structure 300 and the second wiring structure 400, and the connection structures 220 electrically connecting the first wiring structure 300 and the second wiring structure 400 through the encapsulant 240c.

The first wiring structure 300 may include the first redistribution insulating layer 310 and the first redistribution patterns 320. The first redistribution patterns 320 may include the first redistribution line patterns 322 and the first redistribution vias 324.

The encapsulant 240c may be disposed on the upper surface of the first wiring structure 300 to substantially surround the semiconductor chip 100. The encapsulant 240c may fill the space between the first wiring structure 300 and the second wiring structure 400. The encapsulant 240c may be, for example, one of the encapsulants 240-1, 240-2, 240-3, and 240-4 previously described in relation to FIGS. 2A to 2D.

The encapsulant 240c may include a lower encapsulant 242c and an upper encapsulant 244c, wherein the upper encapsulant 244c is disposed on (or vertically stacked on) the lower encapsulant 242c.

The lower encapsulant 242a may cover the upper surface of the first wiring structure 300 and at least a portion of the lateral surface of the semiconductor chip 100 and may substantially surround the lower portions of the of connection structures 220. However, the lower encapsulant 242c may not cover the upper surface of the semiconductor chip 100. In some embodiments, the lower encapsulant 242c may fill the space between the lower surface of the semiconductor chip 100 and the upper surface of the first wiring structure 300 and substantially surround the chip connection members 130. In this case, the underfill layer 135 may be omitted.

An uppermost end of the lower encapsulant 242c may be disposed at a level higher than that of the upper surface of the semiconductor chip 100. The lower encapsulant 242c may include a recess space 242cR which extends downwardly from the uppermost end of the lower encapsulant 242c towards the upper surface of the semiconductor chip 100. In some embodiments, an upper lateral surface of the semiconductor chip 100 will not be exposed by the recess space 242cR. And a lower surface of the recess space 242cR may be disposed at the same level as the upper surface of the semiconductor chip 100.

The upper encapsulant 244c may fill the recess space 242cR of the lower encapsulant 242c and substantially surround a surface of the lower encapsulant 242c in the recess space 242cR and the upper surface of the semiconductor chip 100. A thickness of the lower encapsulant 242c may be greater than a thickness of the upper encapsulant 244c.

The lower encapsulant 242c may include filler, and the upper encapsulant 244c may include filler. However, filler included in the upper encapsulant 244c may have an average diameter that is less than an average diameter of filler included in the lower encapsulant 242c, and/or filler included in the upper encapsulant 244c may have a proportion that is lower than a proportion of filler included in the lower encapsulant 242c. Further, a CTE of the upper encapsulant 244c may be greater than that of the lower encapsulant 242c.

The connection structures 220 may electrically connect the first wiring structure 300 and the second wiring structure 400 through the lower encapsulant 242c. The lower surfaces of the connection structures 220 may respectively contact the first upper-surface connection pads of the first wiring structure 300, and the upper surfaces of the connection structures 220 may respectively contact the second lower-surface connection pads of the second wiring structure 400.

The upper surfaces of the connection structures 220, an upper surface of the uppermost end of the lower encapsulant 242c, and an upper surface of the upper encapsulant 244c may be disposed at the same level.

The second wiring structure 400 may be disposed on the lower encapsulant 242c, the upper encapsulant 244c, and the connection structures 220. The second wiring structure 400 may include the second redistribution insulating layer 410 and the second redistribution patterns 420. The second redistribution patterns 420 may include the second redistribution line patterns 422 and the second redistribution vias 424.

FIGS. 6A to 6H are related cross-sectional views illustrating a method of manufacture for a semiconductor package according to embodiments of the inventive concept (e.g., the semiconductor package of FIG. 1).

Figure 6A:
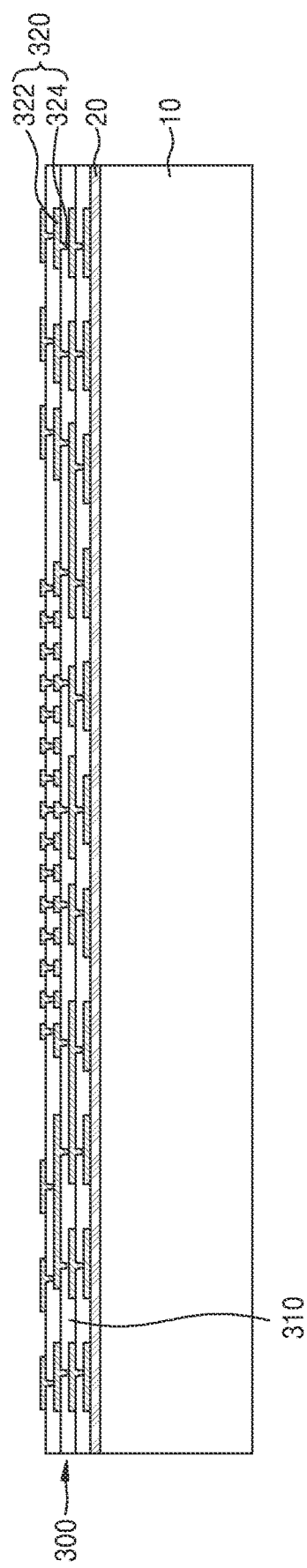

Referring to FIG. 6A, the first wiring structure 300 may be formed on a carrier substrate 10 to which a release film 20 is attached.

The carrier substrate 10 may include an arbitrary material having stability with respect to subsequent processes and the like. In some embodiments, when it is intended to separate and remove the carrier substrate 10 by laser ablation, the carrier substrate 10 may include a transparent substrate. In some other embodiments, when it is intended to separate and remove the carrier substrate 10 by heating, the carrier substrate 10 may include a heat-resistant substrate. For example, the carrier substrate 10 may include a semiconductor substrate, a ceramic substrate, or a glass substrate. Alternately, for example, the carrier substrate 10 may include, but is not limited to, a heat-resistant organic polymer material, such as polyimide (PI), polyetheretherketone (PEEK), poly(ethersulfone) (PES), or poly(phenylene sulfide) (PPS).

The release film 20 may include, for example, a laser reaction layer or a thermal reaction layer capable of separating the carrier substrate 10 by being vaporized in reaction to subsequent laser irradiation or heating. In some embodiments, the release film 20 may include a single layer or may have a multilayered structure including a release layer connected to both surfaces of a backbone layer. The backbone layer may include, for example, a thermoplastic polymer. The release layer may include, for example, a copolymer of acryl and silicone.

The first wiring structure 300 may include the first redistribution insulating layer 310 and the plurality of first redistribution patterns 320. In some embodiments, the first wiring structure 300 may include vertically stacked first redistribution insulating layers 310. The first redistribution patterns 320 may include the first redistribution line patterns 322 and the first redistribution vias 324. Some of the first redistribution line patterns 322 disposed on the upper surface of the first wiring structure 300 may be referred to as first upper-surface connection pads, and some of the first redistribution line patterns 322 disposed on the lower surface of the first wiring structure 300 may be referred to as first lower-surface connection pads.

In some embodiments, the first wiring structure 300 may be formed by a redistribution process. For example, the first wiring structure 300 may be formed by alternately forming (or stacking) the first redistribution insulating layers 310 and the first redistribution patterns 320. In some other embodiments, the first wiring structure 300 may include a printed circuit board.

Figure 6B:
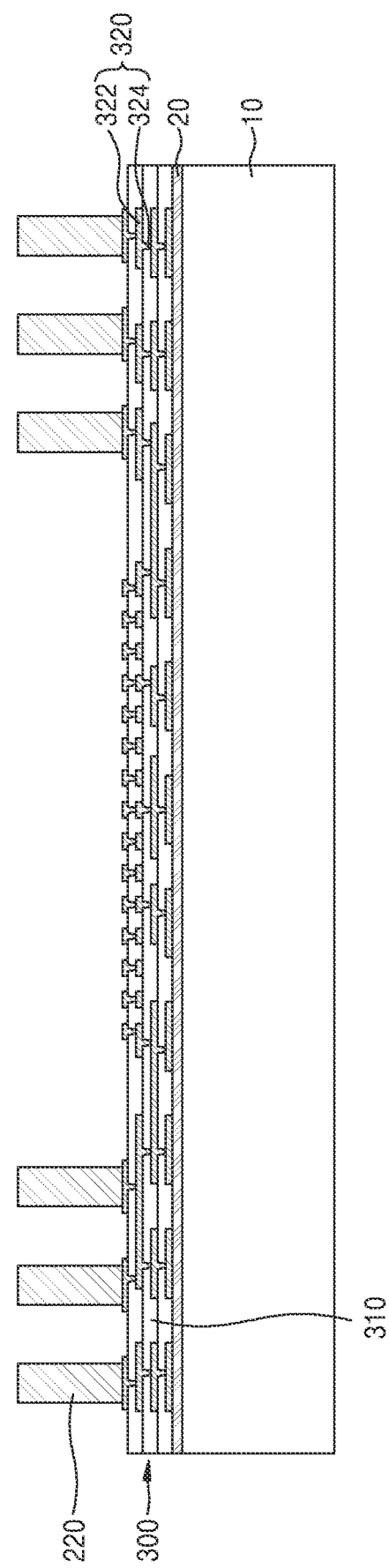

Referring to FIG. 6B, the connection structures 220 may be disposed on the first wiring structure 300. In some embodiments, the connection structures 220 may be formed with a columnar shape, and then connected to some of the of first upper-surface connection pads. In other embodiments, the connection structures 220 may be formed using a plating process. The connection structures 220 may each be formed with a thickness of about 200 μm or more.

Figure 6C:
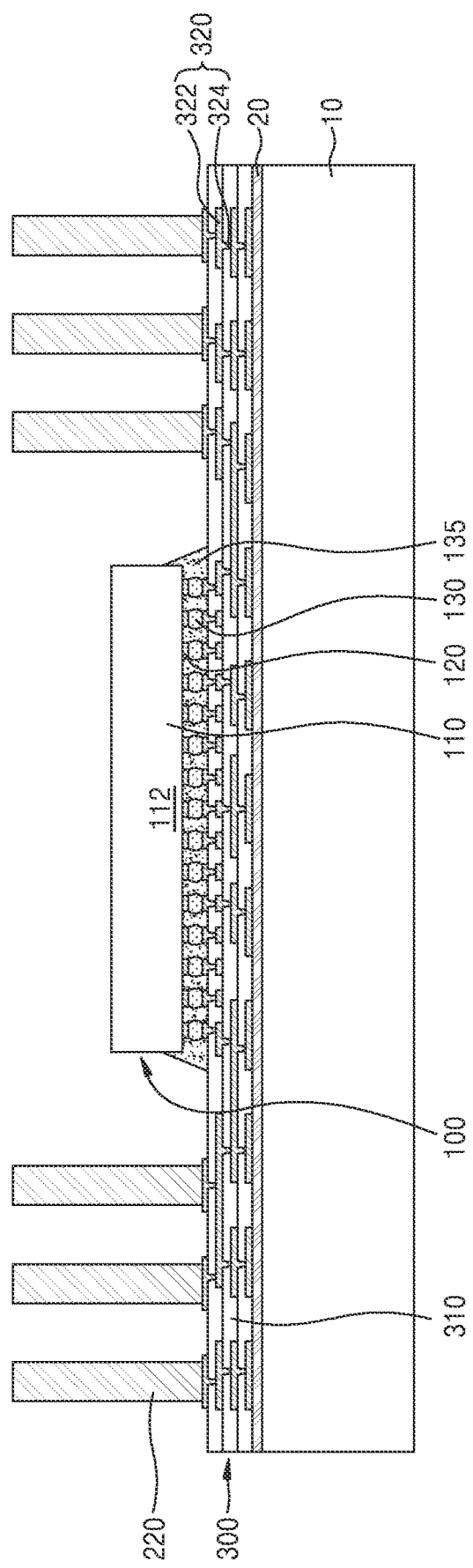

Referring to FIG. 6C, the at least one semiconductor chip 100 may be connected to the first wiring structure 300. That is, the at least one semiconductor chip 100 may be connected to the first wiring structure 300 and may be spaced apart from the connection structures 220 in a horizontal direction. In this regard, the at least one semiconductor chip 100 may be connected to the first wiring structure 300 such that the upper surface of the at least one semiconductor chip 100 is disposed at a level lower than the upper surfaces of the connection structures 220. The semiconductor chip 100 may be disposed in a face-down position, such that the chip pads 120 face towards the first wiring structure 300 and may be connected to the upper surface of the first wiring structure 300. The chip connection members 130 may be arranged between the chip pads 120 and at least some others of the first upper-surface connection pads. For example, the chip connection members 130 may be respectively connected to the chip pads 120, and then connected to some of the first upper-surface connection pads corresponding to the chip connection members 130, thereby connecting the semiconductor chip 100 to the first wiring structure 300.

The underfill layer 135 may be formed between the semiconductor chip 100 and the first wiring structure 300 to substantially surround the chip connection members 130. However, as previously noted, in some embodiments, the underfill layer 135 may be omitted.

Referring to FIG. 6D, the lower encapsulant 242 may be formed on the first wiring structure. The lower encapsulant 242 may be formed to cover the upper surface of the first wiring structure 300 and at least a portion of the lateral surface of the semiconductor chip 100, and to substantially surround the lower portions of the connection structures 220, but not to cover the upper surface of the semiconductor chip 100. For example, the lower encapsulant 242 may be formed such that the upper surface of the lower encapsulant 242 is disposed at a level equal to or lower than that of the upper surface of the semiconductor chip 100. In some embodiments, when the underfill layer 135 is omitted, the lower encapsulant 242 may be formed to fill the space between the lower surface of the semiconductor chip 100 and the upper surface of the first wiring structure 300 and substantially surround the chip connection members 130.

The lower encapsulant 242 may include filler. For example, the lower encapsulant 242 may have a thickness ranging from between about 90 μm to about 170 μm. In some embodiments, the lower encapsulant 242 may be formed to cover the lower lateral surface of the semiconductor chip 100 but not to cover the upper lateral surface of the semiconductor chip 100. The lower encapsulant 242 may be formed such that the upper surface of the lower encapsulant 242 may be disposed at a level lower than that of the upper surface of the semiconductor chip 100. For example, a portion of the lateral surface of the semiconductor chip 100 which extends downward by as much as about 5 μm to about 10 μm from an uppermost end of the lateral surface, may not be covered by the lower encapsulant 242.

The lower encapsulant 242a included in the semiconductor package 1000a of FIG. 3 may be formed to cover the entire lateral surface of the semiconductor chip 100, but not to cover the upper surface of the semiconductor chip 100. For example, the lower encapsulant 242a may be formed such that the upper surface of the lower encapsulant 242a is disposed at the same level as the upper surface of the semiconductor chip 100.

Figure 6E:
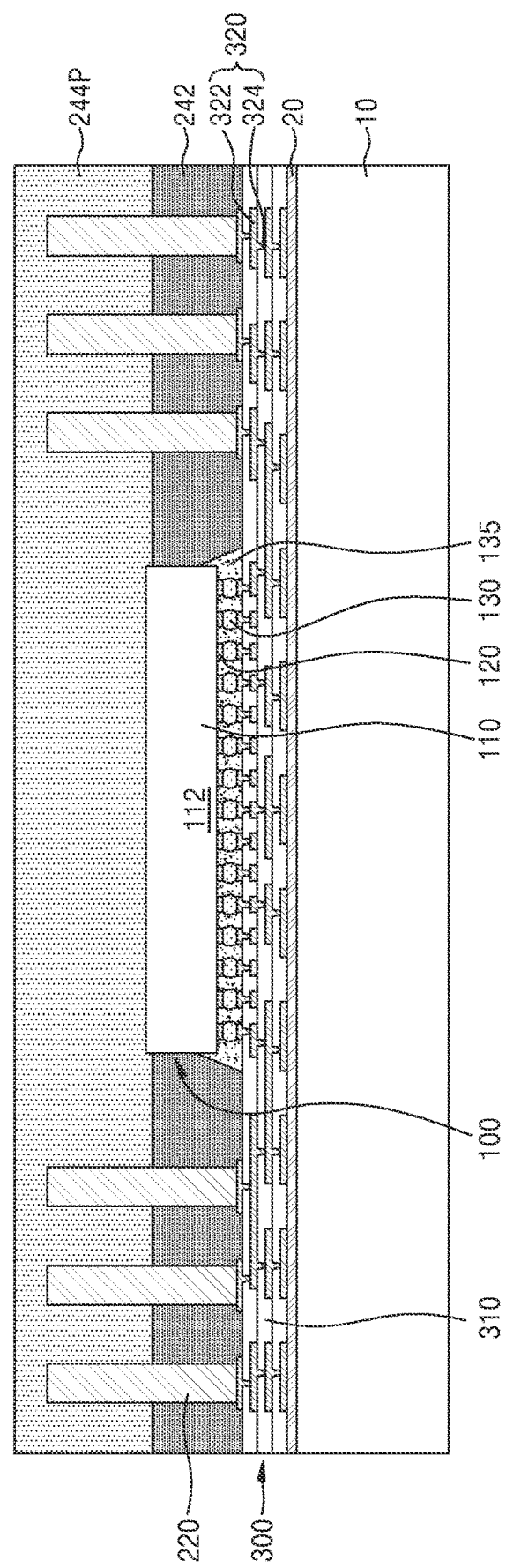

Referring to FIG. 6E, a preliminary upper encapsulant 244P may be formed on the lower encapsulant 242. The preliminary upper encapsulant 244P may be formed to cover the upper surface of the lower encapsulant 242 and the upper lateral surface and the upper surface of the semiconductor chip 100. The preliminary upper encapsulant 244P may be formed to substantially surround upper portions of the connection structure 220 and cover the upper surfaces of the connection structure 220 while having an upper surface that is disposed at a level higher than that of the upper surfaces of the connection structure 220.

Although the preliminary upper encapsulant 244P may include filler, the preliminary upper encapsulant 244P may or may not include filler. Indeed, the preliminary upper encapsulant 244P may not include filler. However, where the preliminary upper encapsulant 244P includes filler, the filler may have an average diameter that is less than the average diameter of filler included in the lower encapsulant 242. Alternately, filler included in the preliminary upper encapsulant 244P may have a proportion that is lower than a proportion of filler included in the lower encapsulant 242. Further, a CTE of the preliminary upper encapsulant 244P may be greater than the CTE of the lower encapsulant 242.

Figure 6F:
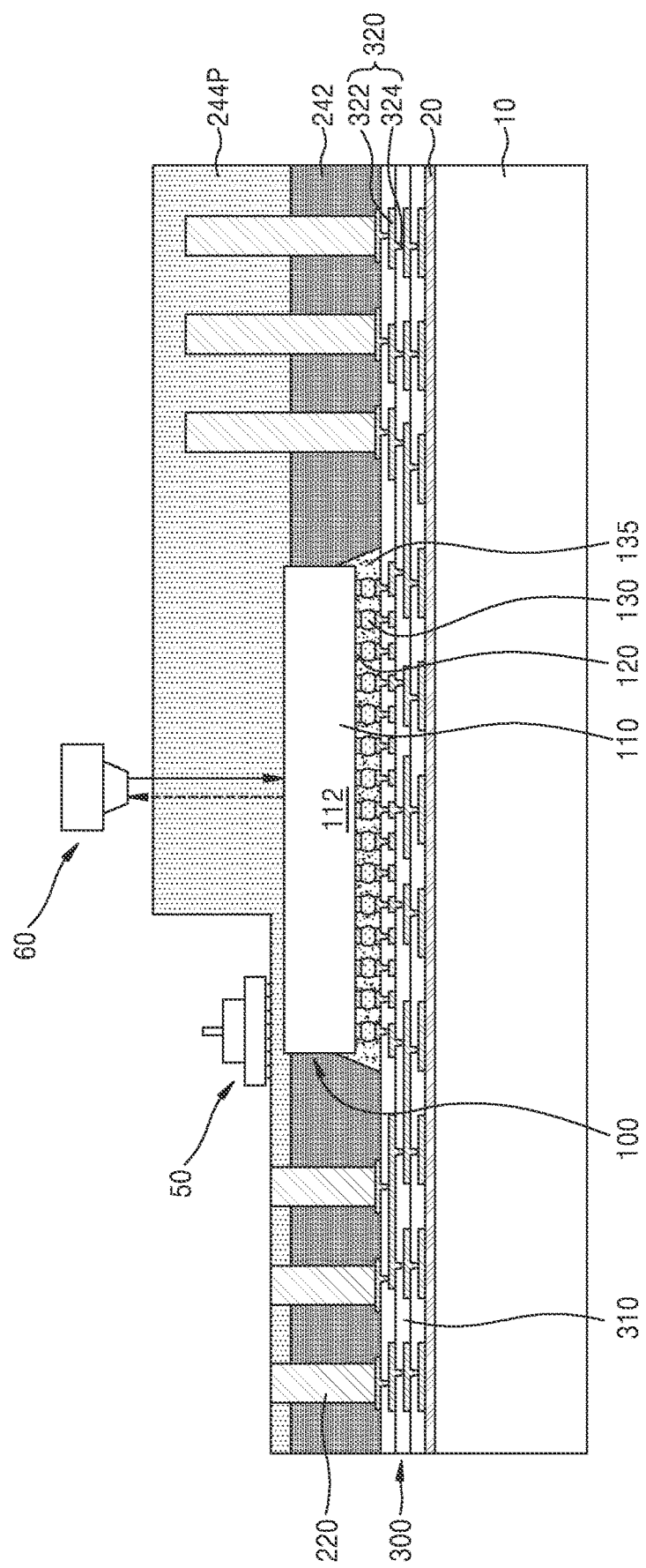

Referring to FIGS. 6E and 6F, the upper encapsulant 244 may be formed by removing an upper portion of the preliminary upper encapsulant 244P. The upper encapsulant 244, which is a lower portion of the preliminary upper encapsulant 244P remaining after the upper portion of the preliminary upper encapsulant 244P is removed, may cover the upper surface of the semiconductor chip 100. During the process of removing the upper portion of the preliminary upper encapsulant 244P, respective upper portions of the connection structure 220 may also be removed.

In some embodiments, the upper encapsulant 244 may be formed by removing the upper portion of the preliminary upper encapsulant 244P using a mechanical polishing process (e.g., applying a grinder 50). During the removal of the upper portion of the preliminary upper encapsulant 244P using the grinder 50, for example, a thickness of a remaining portion of the upper encapsulant 244 may be measured using a non-contact gauge (NCG) 60.

Because each of the preliminary upper encapsulant 244P and the upper encapsulant 244, which is a remaining lower portion of the preliminary upper encapsulant 244P may not include filler, or alternately filler included in the upper encapsulant 244 may have an average diameter that is less than the average diameter of filler included in the lower encapsulant 242, or alternately filler included in the upper encapsulant 244 may have a proportion that is lower than a proportion of filler included in the lower encapsulant 242, the thickness measurement process using the NCG 60 may be performed very accurately, since such measurement is notably less affected by filler. Accordingly, because the thickness of the upper encapsulant 244 remaining on the upper surface of the semiconductor chip 100 may be accurately measured by the NCG 60, the upper encapsulant 244 remaining on the upper surface of the semiconductor chip 100 may formed with a relatively low thickness.

Figure 6G:
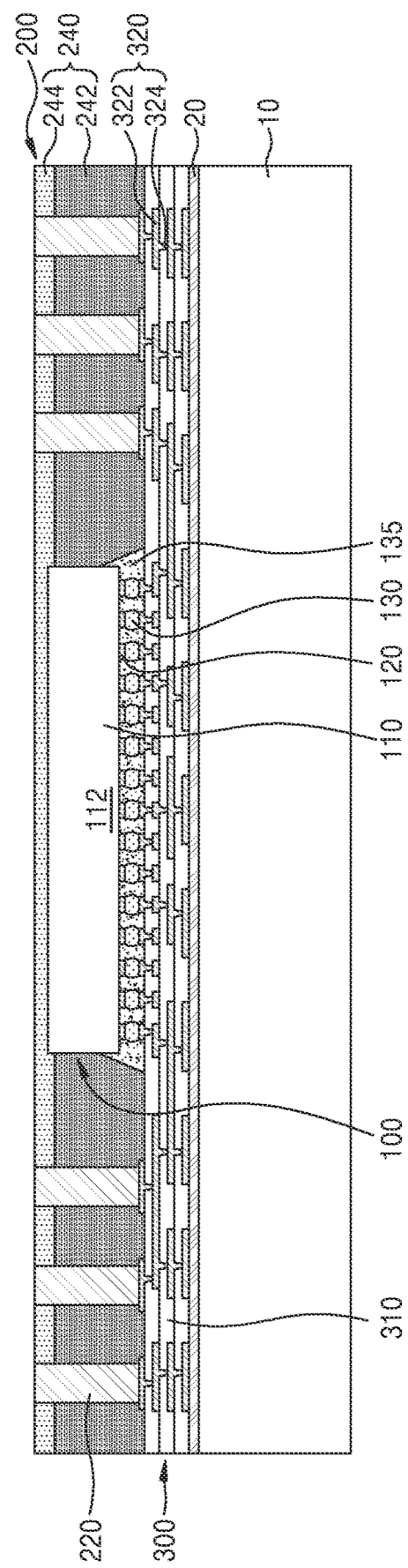

Referring to FIGS. 6F and 6G, upon removing the upper portion of the preliminary upper encapsulant 244P and the upper portions of the connection structures 220, the resulting upper surfaces of the connection structures 220 and the upper surface of the upper encapsulant 244 may be disposed at the same level.

Referring to FIG. 6H, the second wiring structure 400 may be formed on the upper encapsulant 244 and the connection structures 220. The second wiring structure 400 may include the second redistribution insulating layer 410 and the second redistribution patterns 420. In some embodiments, the second wiring structure 400 may include stacked second redistribution insulating layers 410. The second redistribution patterns 420 may include the second redistribution line patterns 422 and the second redistribution vias 424. Some of the second redistribution line patterns 422, which are arranged on the upper surface of the second wiring structure 400, may be referred to as second upper-surface connection pads, and some of the second redistribution line patterns 422, which are arranged on the lower surface of the second wiring structure 400, may be referred to as second lower-surface connection pads.

In some embodiments, the second wiring structure 400 may be formed by a redistribution process. For example, the second wiring structure 400 may be formed by alternately forming the second redistribution insulating layers 410 and the second redistribution patterns 420. In some other embodiments, the second wiring structure 400 may include a PCB.

Referring to FIGS. 1 and 6H, after the second wiring structure 400 is formed, the carrier substrate 10 and the release film 20 may be removed, and the external connection terminals 150 may be respectively connected to the first lower-surface connection pads, thereby substantially completing the semiconductor package 1000.

In some embodiments, the thickness of the second wiring structure 400 may be less than the thickness of the first wiring structure 300, and warpage due to a thickness difference between the first wiring structure 300 and the second wiring structure 400 may conventionally occur. However, because the CTE of the upper encapsulant 244 may be greater than the CTE of the lower encapsulant 242 in certain embodiments of the inventive concept, such warpage may effectively be canceled out, thereby suppressing warpage in semiconductor packages according to embodiments of the inventive concept. It follows that, the structural reliability of the semiconductor packages according to embodiments of the inventive concept is enhanced, despite the reduced thickness of the semiconductor packages.

Figure 7B:
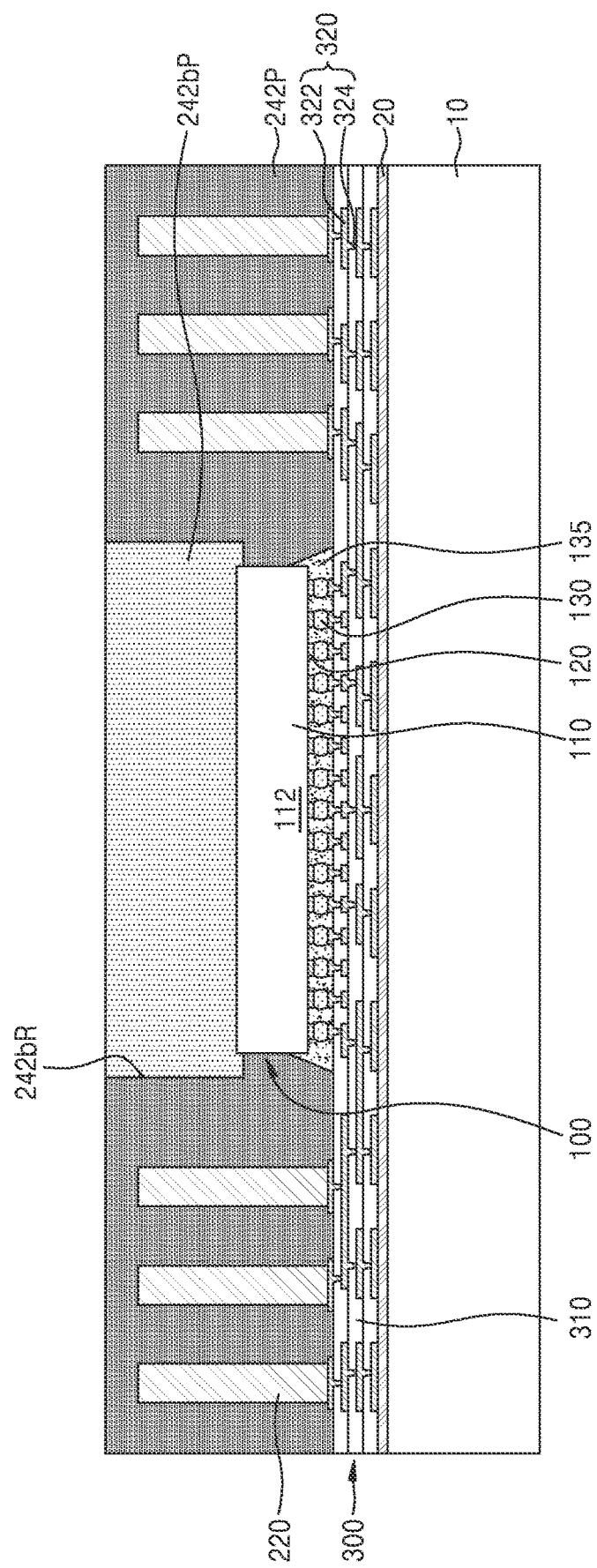
Figure 7C:
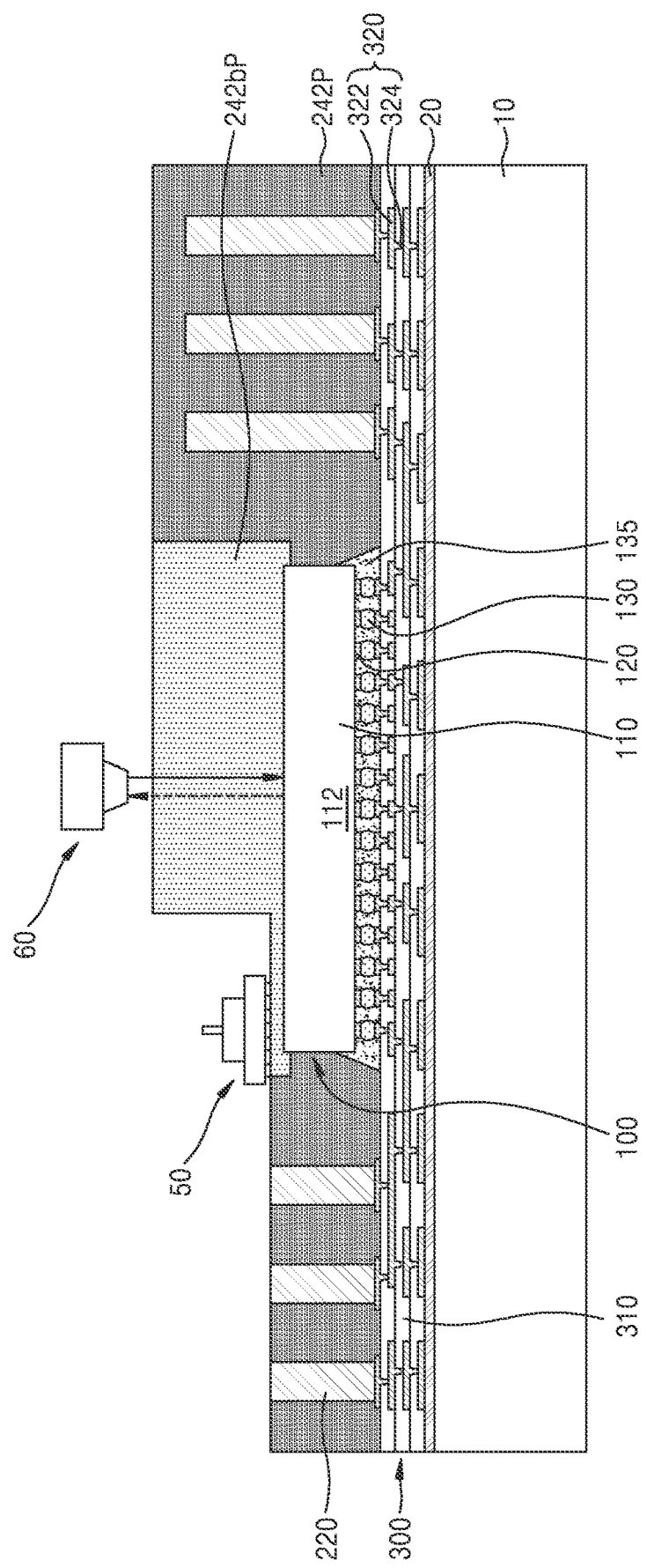

FIGS. 7A to 7C are related cross-sectional views illustrating a method of manufacture for the semiconductor package 1000b of FIG. 4 according to embodiments of the inventive concept.

Referring to FIGS. 4 and 7A and also referring to the resulting product of FIG. 6C, a preliminary lower encapsulant 242bP may be formed on the first wiring structure 300. The preliminary lower encapsulant 242bP may be formed to cover upper surfaces of the connection structures 220 and the upper surface of the first wiring structure 300, but not to cover the upper surface of the semiconductor chip 100. The preliminary lower encapsulant 242bP may be formed such that an upper surface thereof is disposed at a level higher than that of the upper surface of the semiconductor chip 100 and higher than that of the upper surfaces of the connection structures 220.

In this regard, the preliminary lower encapsulant 242bP may be formed with the recess space 242bR, which extends downwardly from the upper surface of the preliminary lower encapsulant 242bP towards the upper surface of the semiconductor chip 100. In some embodiments, the upper lateral surface of the semiconductor chip 100 may be exposed by the recess space 242bR. In some embodiments, the lower surface of the recess space 242bR may be disposed at a level lower than that of the upper surface of the semiconductor chip 100. For example, the preliminary lower encapsulant 242bP may be formed using a mold including a protruding structure that corresponds to the shape and geometry of the recess space 242bR.

Referring to FIG. 7B, a preliminary upper encapsulant 244bP (see, e.g., 244P of FIG. 6E) may be formed to substantially fill the recess space 242bR. Here, the preliminary upper encapsulant 244bP may substantially overlay a surface of the preliminary lower encapsulant 242bP in the recess space 242bR and the upper surface and the exposed upper lateral surface of the semiconductor chip 100.

Referring to FIG. 7C, the lower encapsulant 242b and the upper encapsulant 244b are formed by selectively removing upper portions of the preliminary lower encapsulant 242bP and the preliminary upper encapsulant 244bP. The upper encapsulant 244b, which is a lower portion of the preliminary upper encapsulant 244bP remaining after the upper portion of the preliminary upper encapsulant 244bP has been removed, may cover the upper surface of the semiconductor chip 100. During the selective removal of the upper portions of the preliminary lower encapsulant 242bP and the preliminary upper encapsulant 244bP, upper portions of the connection structures 200 may also be removed. And as a result, the upper surfaces of the connection structures 220, the upper surface of the uppermost end of the lower encapsulant 242b, and the upper surface of the upper encapsulant 244b may be disposed at the same level.

Further in this regard, it should be noted that the lower encapsulant 242c and the upper encapsulant 244c of the semiconductor package 1000c of FIG. 5, may alternately be formed such that, unlike the recess space 242bR, the recess space 242cR of FIG. 5 has a lower surface disposed at the same level as the upper surface of the semiconductor chip 100.

FIGS. 8A to 8D are respectively cross-sectional views illustrating various semiconductor packages according to embodiments of the inventive concept.

Figure 8A:
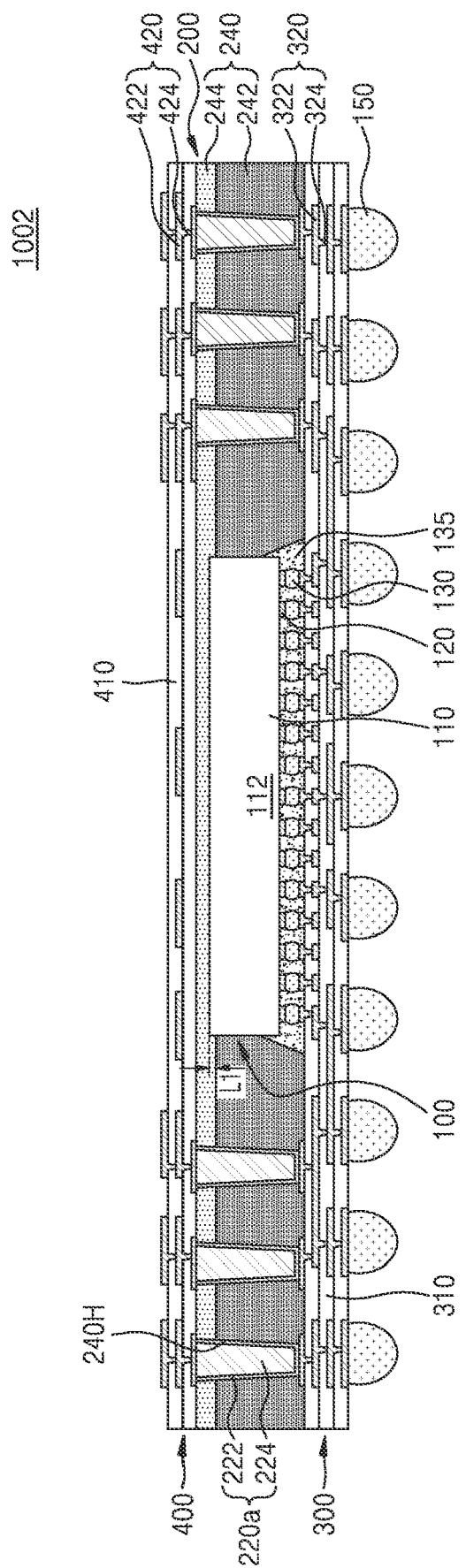
FIGS. 8A, 8B, 8C and 8D (hereafter collectively, "FIGS. 8A to 8D") are respective cross-sectional views of semiconductor packages according to embodiments of the inventive concept.

Referring to FIG. 8A, a semiconductor package 1002 may include connection structures 220a passing through the encapsulant 240 of FIG. 1. That is, the connection structures 220a of FIG. 8A may be compared with the connection structures 220 of FIG. 1 with particular note of the differing shapes.

The connection structures 220a may respectively fill through-holes 240H passing through the encapsulant 240. Each of the connection structures 220a may include a seed layer 222 conformally formed on inner sidewalls and a bottom surface of a corresponding through-hole 240H, as well as a filling conductive layer 224 covering the seed layer 222 and filling the through-hole 240H. In some embodiments, each of the seed layer 222 and the filling conductive layer 224 may include copper (Cu) or a copper alloy.

In some embodiments, each of the connection structures 220a may have a "downwardly tapering shape" characterized by a decreasing horizontal width as the connection structure 220a extends from top to bottom. That is, the horizontal width of each connection structure 220a may increase as the connection structure 220a extend away from the first wiring structure 300 and towards the second wiring structure 400.

Figure 8B:
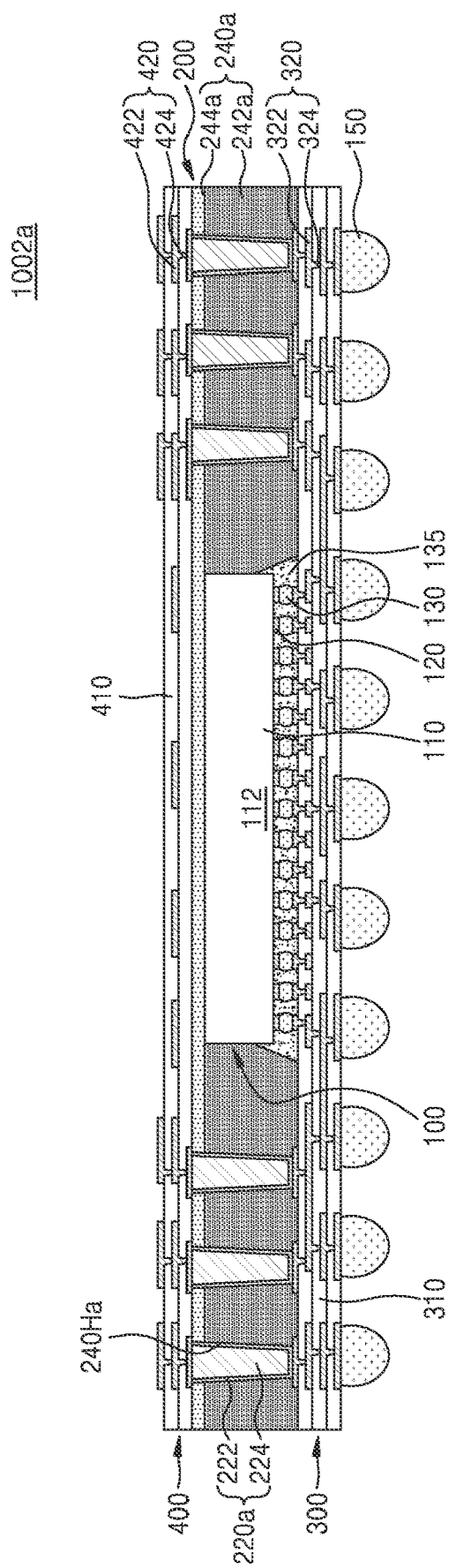

Referring to FIG. 8B, a semiconductor package 1002a may include the connection structures 220a passing through the encapsulant 240a of FIG. 3.

Like the embodiments described in relation to FIG. 8A, each of the connection structures 220a may respectively fill a corresponding through-holes 240Ha and pass through the encapsulant 240a. Each of the connection structures 220a may include the seed layer 222 formed on the inner sidewalls and bottom surface of a through-hole 240Ha, and the filling conductive layer 224 which covers the seed layer 222 and fills the through-hole 240Ha. For example, the seed layer 222 may be formed to conformally cover the inner sidewalls and bottom surface of the through-hole 240Ha, after formation of the filling conductive layer 224, which covers the seed layer 222 and fills the through-hole 240Ha, thereby forming each connection structure 220a.

Figure 8C:
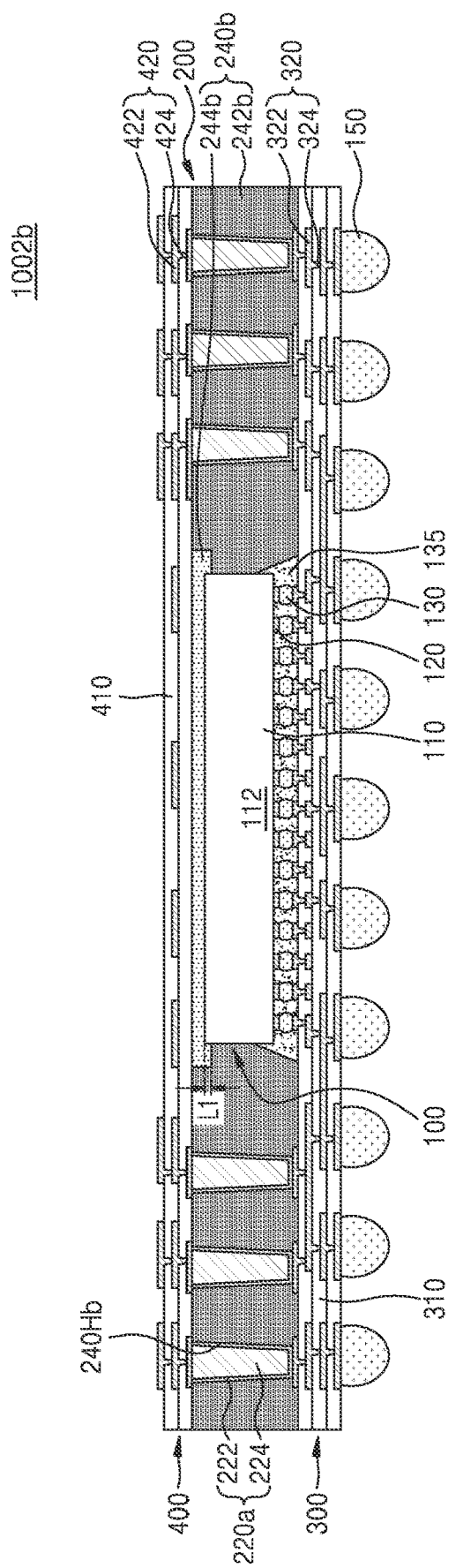

Referring to FIG. 8C, a semiconductor package 1002b may include the connection structures 220a passing through the encapsulant 240b of FIG. 4.

Here, each of the connection structures 220a may respectively fill a through-hole 240Hb passing through the encapsulant 240b. And again, each of the connection structures 220a may include the seed layer 222 and the filling conductive layer 224, as described above.

Figure 8D:
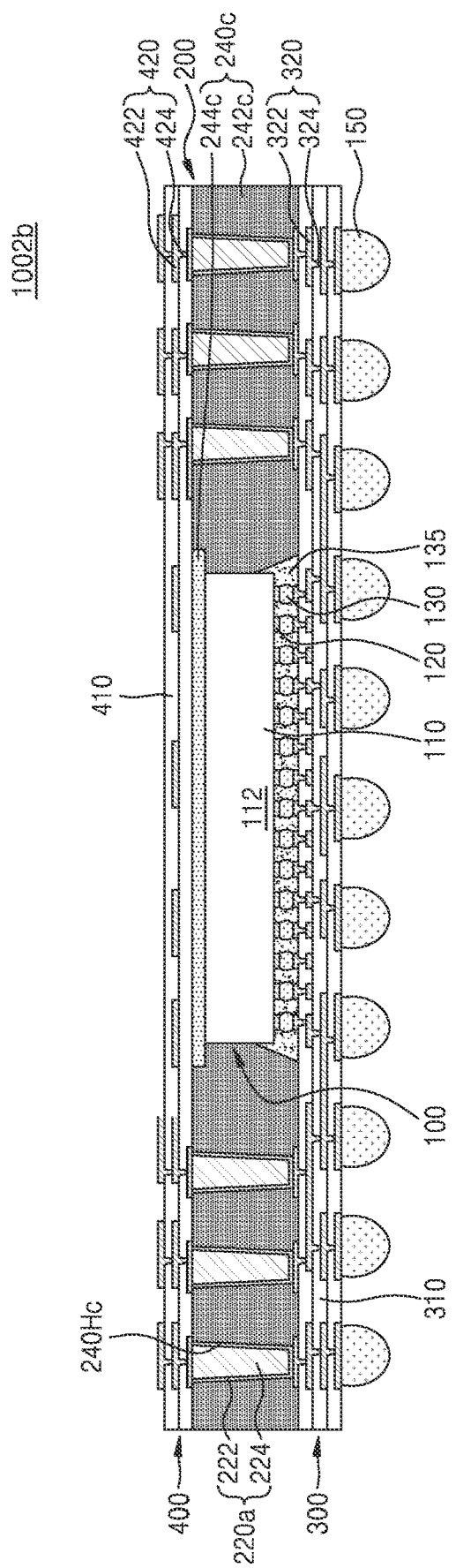

Referring to FIG. 8D, a semiconductor package 1002c may include the connection structures 220a passing through the encapsulant 240c of FIG. 5.

here, each of the connection structures 220a may respectively fill a through-hole 240Hc passing through the encapsulant 240c. Each of the connection structures 220a may include the seed layer 222 and the filling conductive layer 224.

FIGS. 9A to 9F are related cross-sectional views illustrating a method of manufacture for the semiconductor package 1002 of FIG. 8A according to embodiments of the inventive concept.

Referring to FIG. 9A and noting in particular the resulting product of FIG. 6A, the at least one semiconductor chip 100 may be connected (or attached) to the first wiring structure 300 in a face-down orientation, such that the chip pads 120 face towards the first wiring structure 300 allowing connection with the upper surface of the first wiring structure 300. Here, the chip connection members 130 may be disposed between the chip pads 120 and the first upper-surface connection pads.

The underfill layer 135 may be formed between the semiconductor chip 100 and the first wiring structure 300 to substantially surround the chip connection members 130. However, in some embodiments, the underfill layer 135 may be omitted.

Figure 9B:
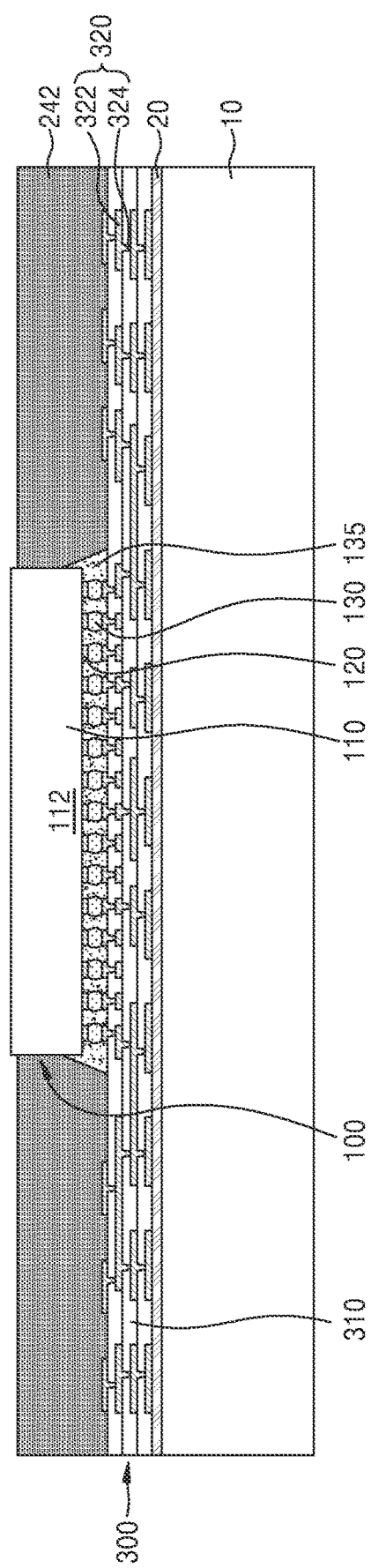
FIGS. 9A, 9B, 9C, 9D, 9E and 9F (hereafter collectively, "FIGS. 9A to 9F") are related cross-sectional views illustrating a method of manufacture for a semiconductor package, according to embodiments of the inventive concept.

Referring to FIG. 9B, the lower encapsulant 242 may be formed on the first wiring structure 300 to cover the upper surface of the first wiring structure 300 and at least a portion of the lateral surface of the semiconductor chip 100, but not cover the upper surface of the semiconductor chip 100. In some embodiments, when the underfill layer 135 is omitted, the lower encapsulant 242 may also substantially fill the space between the lower surface of the semiconductor chip 100 and the upper surface of the first wiring structure 300 and substantially surround the chip connection members 130.

The lower encapsulant 242a included in the semiconductor package 1002a of FIG. 8B may be formed to cover the entire lateral surface of the semiconductor chip 100, but not cover the upper surface of the semiconductor chip 100.

Figure 9C:
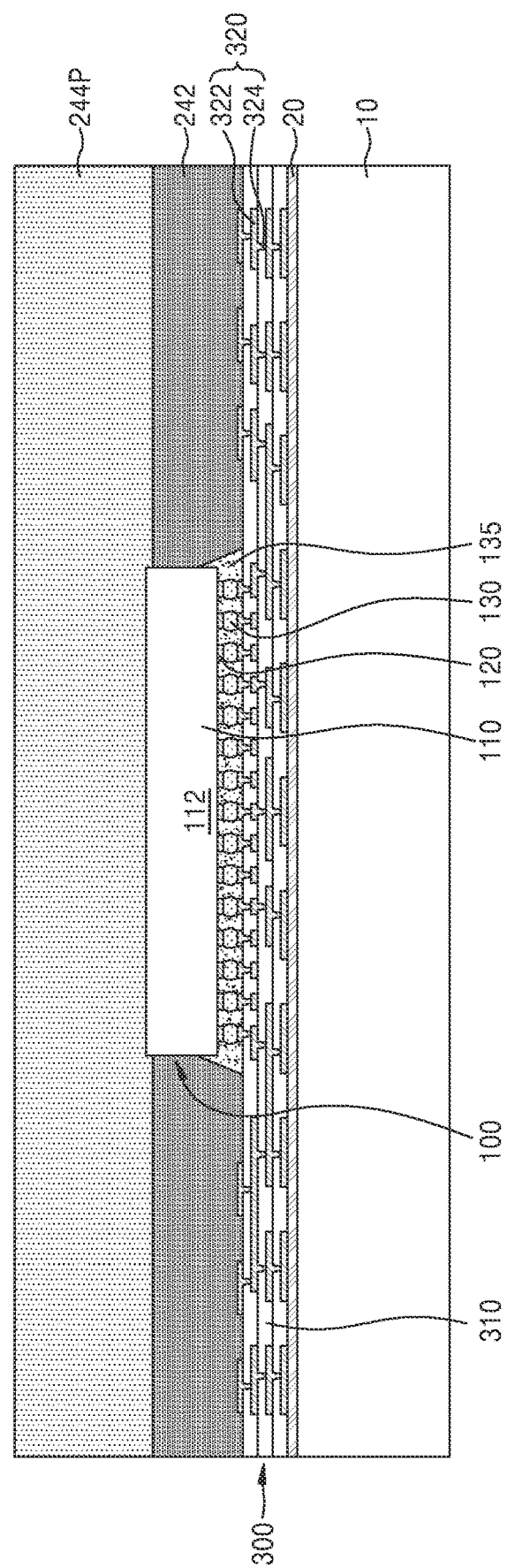

Referring to FIG. 9C, the preliminary upper encapsulant 244P may be formed on the lower encapsulant 242. The preliminary upper encapsulant 244P may be formed to cover the upper surface of the lower encapsulant 242 and the upper lateral surface and the upper surface of the semiconductor chip 100.

Figure 9D:
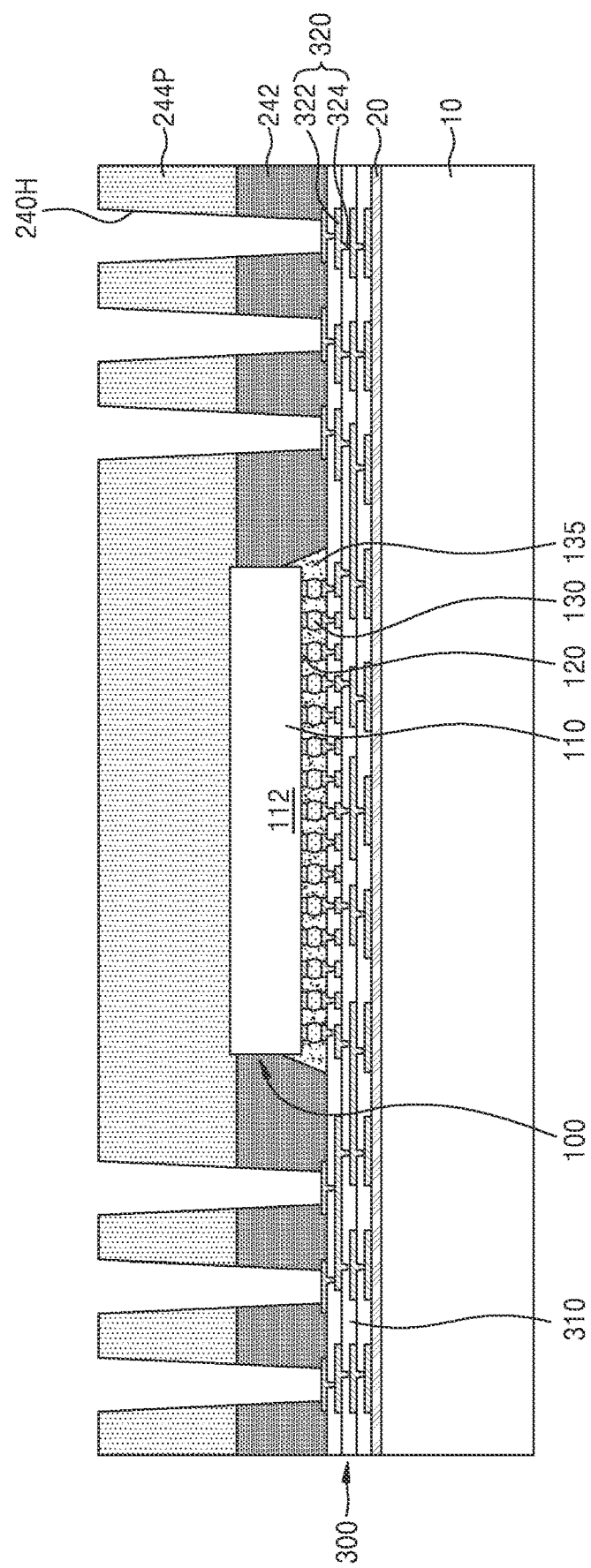
Figure 9H:
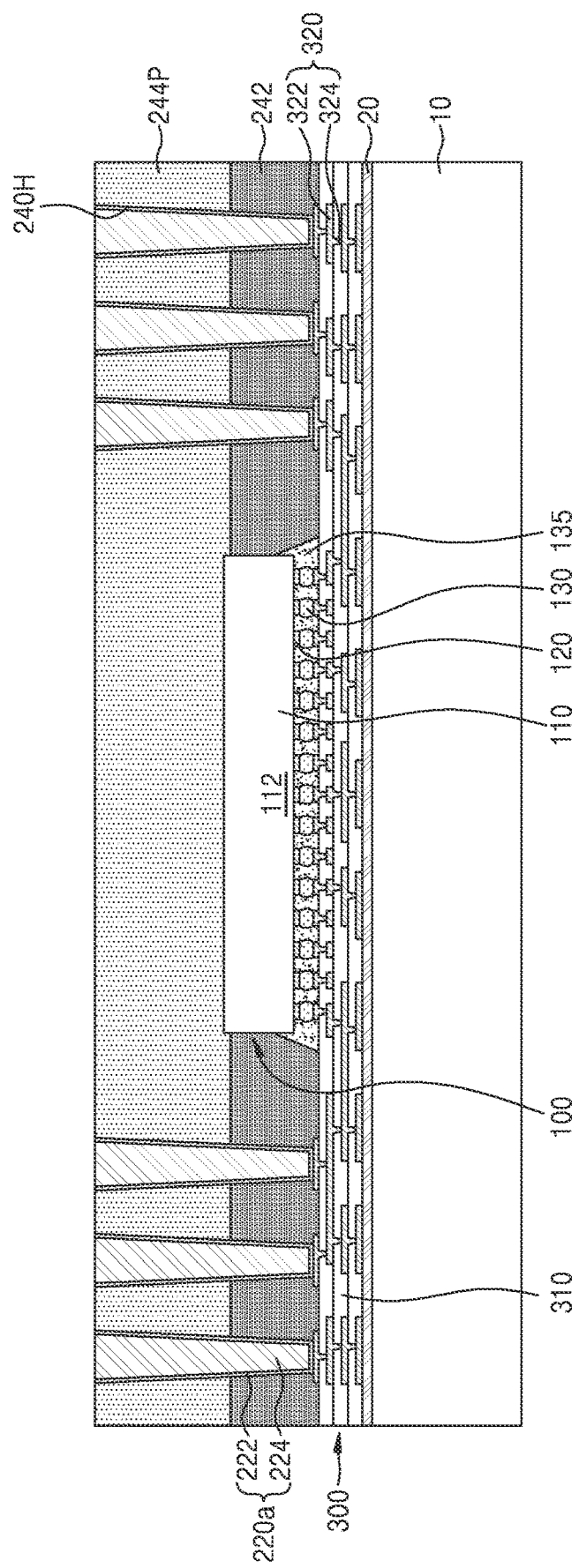
Figure 9H:
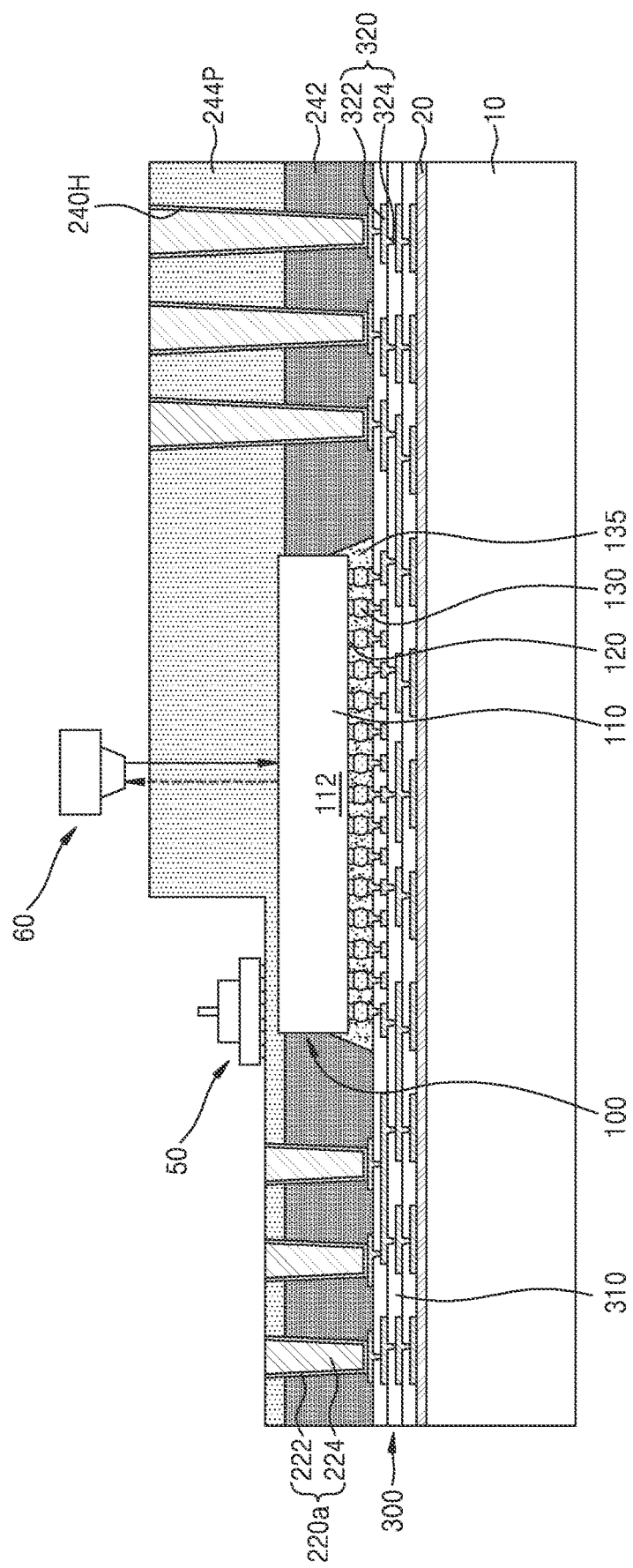

Referring to FIG. 9D, portions of the preliminary upper encapsulant 244P and the lower encapsulant 242 may be selectively removed in order to form the through-holes 240H which may selectively expose upper portions of the first wiring structure 300. For example, in some embodiments, the first upper-surface connection pads may be selectively and respectively exposed by the through-holes 240H.

As noted above, in some embodiments, the through-holes 240H may be formed with a downwardly tapering shape.

Referring to FIG. 9E, the connection structures 220a may be formed to respectively fill the through-holes 240H. For example, each of the connection structures 220a may be formed by sequentially forming the seed layer 222, which conformally covers the inner sidewalls and the bottom surface of the through-hole 240H, and then the filling conductive layer 224, which covers the seed layer 222 and fills the through-hole 240H. In some embodiments, the seed layer 222 may be formed using a physical vapor deposition process, and the filling conductive layer 224 may be formed using a plating process. In some embodiments, the seed layer 222 and the filling conductive layer 224 may also be formed on the upper surface of the preliminary upper encapsulant 244P.

Referring to FIGS. 9E and 9F, the upper encapsulant 244 may be formed by removing the upper portion of the preliminary upper encapsulant 244P. The upper encapsulant 244, which is the lower portion of the preliminary upper encapsulant 244P remaining after the upper portion of the preliminary upper encapsulant 244P is removed, may cover the upper surface of the semiconductor chip 100. During the removal of the upper portion of the preliminary upper encapsulant 244P, the upper portions of the connection structures 220a may also be removed. Hence, the upper surfaces of the connection structures 220a and the upper surface of the upper encapsulant 244 may be disposed at the same level.

Those skilled in the art will appreciate that the semiconductor package 1002b of FIG. 8C and the semiconductor package 1002c of FIG. 8D may be similarly formed using the method of manufacture described in relation to FIGS. 9A to 9H, in relation to the embodiments of FIGS. 7A to 7C.

While the inventive concept has been particularly shown and described with reference to embodiments thereof, it will be understood that various changes in form and details may be made therein without departing from the scope of the following claims.

What is claimed is:

1. A method of manufacture for a semiconductor package, the method comprising:
    forming a first wiring structure;
    connecting a semiconductor chip to the first wiring structure;
    forming a lower encapsulant on the first wiring structure to cover at least a portion of a lateral surface of the semiconductor chip, wherein the lower encapsulant does not cover an upper surface of the semiconductor chip;
    forming a preliminary upper encapsulant on the lower encapsulant and the semiconductor chip;
    forming an upper encapsulant on the lower encapsulant by removing an upper portion of the preliminary upper encapsulant, wherein the upper encapsulant covers the upper surface of the semiconductor chip and the upper encapsulant has a materially different composition than the lower encapsulant; and
    forming a second wiring structure on the upper encapsulant.

2. The method of claim 1, wherein the lower encapsulant includes an epoxy-based material including filler, and the upper encapsulant includes an epoxy-based material not including filler.

3. The method of claim 1, wherein the lower encapsulant includes filler having a first average diameter, and the upper encapsulant includes filler having a second average diameter less than the first average diameter.

4. The method of claim 1, wherein the lower encapsulant includes filler having a first proportion, and the upper encapsulant includes filler having a second proportion lower than the first proportion.

5. The method of claim 4, wherein an average diameter of the filler included in the lower encapsulant is greater than an average diameter of the filler included in the upper encapsulant.

6. The method of claim 1, wherein the lower encapsulant has a first coefficient of thermal expansion, and the upper encapsulant has a second coefficient of thermal expansion greater than the first coefficient of thermal expansion.

7. The method of claim 1, wherein the first wiring structure has a first thickness, and the second wiring structure has a second thickness less than the first thickness.

8. The method of claim 1, wherein the lower encapsulant covers a lower lateral surface of the semiconductor chip, and the upper encapsulant covers an upper lateral surface of the semiconductor chip.

9. The method of claim 1, wherein the lower encapsulant covers an entire lateral surface of the semiconductor chip.

10. The method of claim 9, wherein an upper surface of the lower encapsulant is disposed at the same level as the upper surface of the semiconductor chip.

11. The method of claim 1, wherein the first wiring structure includes:
    a first redistribution insulating layer; and
    first redistribution patterns connected to the semiconductor chip and covered, at least in part, by the first redistribution insulating layer, wherein the first redistribution patterns include first redistribution line patterns and first redistribution vias connected through the first redistribution insulating layer; and
    the second wiring structure includes second redistribution patterns.

12. A method of manufacture for a semiconductor package, the method comprising:
    forming a first wiring structure including first redistribution patterns;
    electrically connecting a semiconductor chip to the first wiring structure;
    forming a lower encapsulant including first filler on the first wiring structure, wherein the lower encapsulant covers at least a portion of a lateral surface of the semiconductor chip and does not cover an upper surface of the semiconductor chip;
    forming a preliminary upper encapsulant on the lower encapsulant and the semiconductor chip, the preliminary upper encapsulant including second filler;
    removing an upper portion of the preliminary upper encapsulant to form an upper encapsulant including the second filler on the lower encapsulant, wherein the upper encapsulant covers the upper surface of the semiconductor chip; and
    forming a second wiring structure including second redistribution patterns on the upper encapsulant,
    wherein the second filler has an average diameter less than that of the first filler, or the second filler has a proportion lower than that of first filler.

13. The method of claim 12, comprising:
connecting connection structures respectively between the first redistribution patterns and the second redistribution patterns through the lower encapsulant and the upper encapsulant.

14. The method of claim 13, wherein the lower encapsulant surrounds respective lower portions of the connection structures
wherein the preliminary upper encapsulant has an upper surface disposed at a level higher than that of respective upper surfaces of the connection structures, and
wherein removing the upper portion of the preliminary upper encapsulant comprises removing respective upper portions of the connection structures.

15. The method of claim 13, wherein the forming of the lower encapsulant includes:
forming a preliminary lower encapsulant covering an upper surface of the first wiring structure and surrounding the connection structures, wherein an upper surface of the preliminary lower encapsulant is disposed at a level higher than that of upper surfaces of the connection structures, and the preliminary lower encapsulant includes a recess space extending downwardly from the upper surface to expose at least a portion of the upper surface of the semiconductor chip; and
the forming of the upper encapsulant includes:
forming a preliminary upper encapsulant to fill the recess space; and
selectively removing upper portions of the preliminary upper encapsulant.

16. The method of claim 12, wherein the forming of the lower encapsulant includes forming the lower encapsulant to cover an upper surface of the first wiring structure and at least a portion of a lateral surface of the semiconductor chip, wherein the lower encapsulant has an upper surface disposed at a level that is equal to or lower than that of the upper surface of the semiconductor chip, and the forming of the upper encapsulant includes forming a preliminary upper encapsulant on the lower encapsulant and the semiconductor chip, and the method of claim 12 further comprises:
forming through-holes through the preliminary upper encapsulant and the lower encapsulant;
forming connection structures to respectively fill the through-holes; and thereafter,
removing an upper portion of the preliminary upper encapsulant.

17. The method of claim 12, wherein the first wiring structure has a first thickness,
the lower encapsulant has a first coefficient of thermal expansion,
the upper encapsulant has a second coefficient of thermal expansion greater than the first coefficient of thermal expansion, and
the second wiring structure has a second thickness less than the first thickness.

18. A method of manufacture for a semiconductor package, the method comprising:
forming a first wiring structure;
electrically connecting a semiconductor chip to the first wiring structure;
forming a lower encapsulant including first filler having a first average diameter on the first wiring structure to cover an upper surface of the first wiring structure and at least a portion of a lateral surface of the semiconductor chip, wherein an upper surface of the lower encapsulant is disposed at a level equal to or lower than that of an upper surface of the semiconductor chip;
forming a preliminary upper encapsulant on the lower encapsulant and the semiconductor chip, wherein the preliminary upper encapsulant includes second filler having a second average diameter less than the first average diameter of the first filler;
forming through-holes through the preliminary upper encapsulant and the lower encapsulant;
forming connection structures to respectively fill the through-holes, wherein the connection structures electrically connect to the first wiring structure;
removing an upper portion of the preliminary upper encapsulant to form an upper encapsulant; and
forming a second wiring structure on the upper encapsulant.

19. The method of claim 18, wherein a coefficient of thermal expansion for the upper encapsulant is greater than a coefficient of thermal expansion for the lower encapsulant,
a second thickness of the second wiring structure is less than a first thickness of the first wiring structure,
the first thickness ranges from between 30 µm to 50 µm, and
the second thickness ranges from between 20 µm to 40 µm.

20. The method of claim 18, wherein the first average diameter ranges from between about 15 µm to about 50 µm,
the second average diameter ranges from between 3 µm to 30 µm, and
a proportion of first filler is equal to or greater than 80% by weight, and a proportion of second filler is less than 80% by weight.

* * * * *